US009728400B2

(12) United States Patent
Hanashima et al.

(10) Patent No.: US 9,728,400 B2
(45) Date of Patent: Aug. 8, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC, Tokyo (JP)

(72) Inventors: Takeo Hanashima, Toyama (JP); Hiroshi Ashihara, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/011,117

(22) Filed: Jan. 29, 2016

(65) Prior Publication Data

US 2016/0155627 A1 Jun. 2, 2016

Related U.S. Application Data

(63) Continuation of application No. 14/619,318, filed on Feb. 11, 2015.

(30) Foreign Application Priority Data

Feb. 12, 2014 (JP) ................................ 2014-024480

(51) Int. Cl.
*C23C 16/455* (2006.01)
*H01L 21/02* (2006.01)
(Continued)

(52) U.S. Cl.
CPC .......... *H01L 21/0228* (2013.01); *C23C 16/34* (2013.01); *C23C 16/36* (2013.01);
(Continued)

(58) Field of Classification Search
None
See application file for complete search history.

(56) References Cited

U.S. PATENT DOCUMENTS

2007/0032047 A1 2/2007 Hasebe et al.
2011/0021033 A1 * 1/2011 Ikeuchi ................ C23C 16/402
438/758

(Continued)

FOREIGN PATENT DOCUMENTS

JP 2004-281853 * 3/2003
JP 2011-029284 A 2/2011

(Continued)

OTHER PUBLICATIONS

Okuda JP2004-281853 Eng mach Trans Mar. 2003.*

(Continued)

*Primary Examiner* — Joseph Miller, Jr.
(74) *Attorney, Agent, or Firm* — Volpe and Koenig, P.C.

(57) ABSTRACT

A method of manufacturing a semiconductor device is disclosed. The method includes forming a film on a substrate by performing a cycle a predetermined number of times, wherein the cycle includes non-simultaneously performing: supplying a precursor gas to the substrate in a process chamber; exhausting the precursor gas in the process chamber through an exhaust system; confining a reaction gas, which differs in chemical structure from the precursor gas, in the process chamber by supplying the reaction gas to the substrate in the process chamber while the exhaust system is closed; and exhausting the reaction gas in the process chamber through the exhaust system while the exhaust system is opened.

15 Claims, 17 Drawing Sheets

(51) Int. Cl.

| | |
|---|---|
| ***C23C 16/52*** | (2006.01) |
| ***C23C 16/44*** | (2006.01) |
| ***C23C 16/34*** | (2006.01) |
| ***C23C 16/36*** | (2006.01) |
| ***C23C 16/38*** | (2006.01) |

(52) U.S. Cl.

CPC .......... *C23C 16/38* (2013.01); *C23C 16/4412* (2013.01); *C23C 16/455* (2013.01); *C23C 16/45525* (2013.01); *C23C 16/45553* (2013.01); *C23C 16/52* (2013.01); *H01L 21/02167* (2013.01)

(56) References Cited

U.S. PATENT DOCUMENTS

| | | | |
|---|---|---|---|
| 2011/0065289 | A1 | 3/2011 | Asai |
| 2012/0190215 | A1 | 7/2012 | Ikeuchi et al. |
| 2013/0102132 | A1 | 4/2013 | Takeda |
| 2013/0237064 | A1 | 9/2013 | Kirikihira et al. |
| 2013/0252439 | A1 | 9/2013 | Hirose et al. |

FOREIGN PATENT DOCUMENTS

| | | | |
|---|---|---|---|
| JP | 2011-082493 | A | 4/2011 |
| JP | 2012-049506 | A | 3/2012 |
| JP | 2013-040398 | A | 2/2013 |
| JP | 2013-102130 | A | 5/2013 |
| JP | 2013-187507 | A | 9/2013 |
| JP | 2013-225660 | A | 10/2013 |

OTHER PUBLICATIONS

JP Office Action, JP Patent Application No. 2014-024480, Oct. 6, 2015, 2 pages (English translation attached).

JP Decision to Grant, JP Patent Application No. 2014-024480, Nov. 10, 2015, 3 pages (English translation attached).

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This patent application is a continuation of U.S. patent application Ser. No. 14/619,318 filed on Feb. 11, 2015 and claims priority under 35 U.S.C. §119 of Japanese Patent Application No. 2014-024480, filed on Feb. 12, 2014, the entire contents of which are hereby incorporated by reference.

TECHNICAL FIELD

The present disclosure relates to a method of manufacturing a semiconductor device, which includes a procedure for forming a thin film on a substrate, a substrate processing apparatus, and a recording medium.

BACKGROUND

As an example of procedures of manufacturing a semiconductor device such as a flash memory, a DRAM, and the like, a procedure of forming a film on a substrate is often carried out, where a cycle that non-simultaneously performs a process of supplying a precursor gas to a substrate and a process of activating a reaction gas, which differs in chemical structure from the precursor gas, and supplying the activated reaction gas to the substrate is performed a predetermined number of times.

However, depending on a process temperature during the film forming process, the activation of the reaction gas may be insufficient, which may deteriorate productivity of forming a film and lower the quality of the film. A method of activating a reaction gas with plasma may be employed, but the high energy of plasma in this method may damage a substrate.

SUMMARY

The present disclosure provides some embodiments of a technology capable of improving productivity of a film forming process and quality of a film without having to use plasma when such a film is formed on a substrate using a precursor gas and a reaction gas.

According to one embodiment of the present disclosure, there is provided a technique, including forming a film on a substrate by performing a cycle a predetermined number of times, the cycle including non-simultaneously performing: supplying a precursor gas to the substrate in a process chamber; exhausting the precursor gas in the process chamber through an exhaust system; confining a reaction gas, which differs in chemical structure from the precursor gas, in the process chamber by supplying the reaction gas to the substrate in the process chamber while the exhaust system is closed; and exhausting the reaction gas in the process chamber through the exhaust system while the exhaust system is opened

DETAILED DESCRIPTION

<One Embodiment of the Present Disclosure>

One embodiment of the present disclosure is described below with reference to FIGS. 1 to 3.

(1) Configuration of Substrate Processing Apparatus

Figure 1:
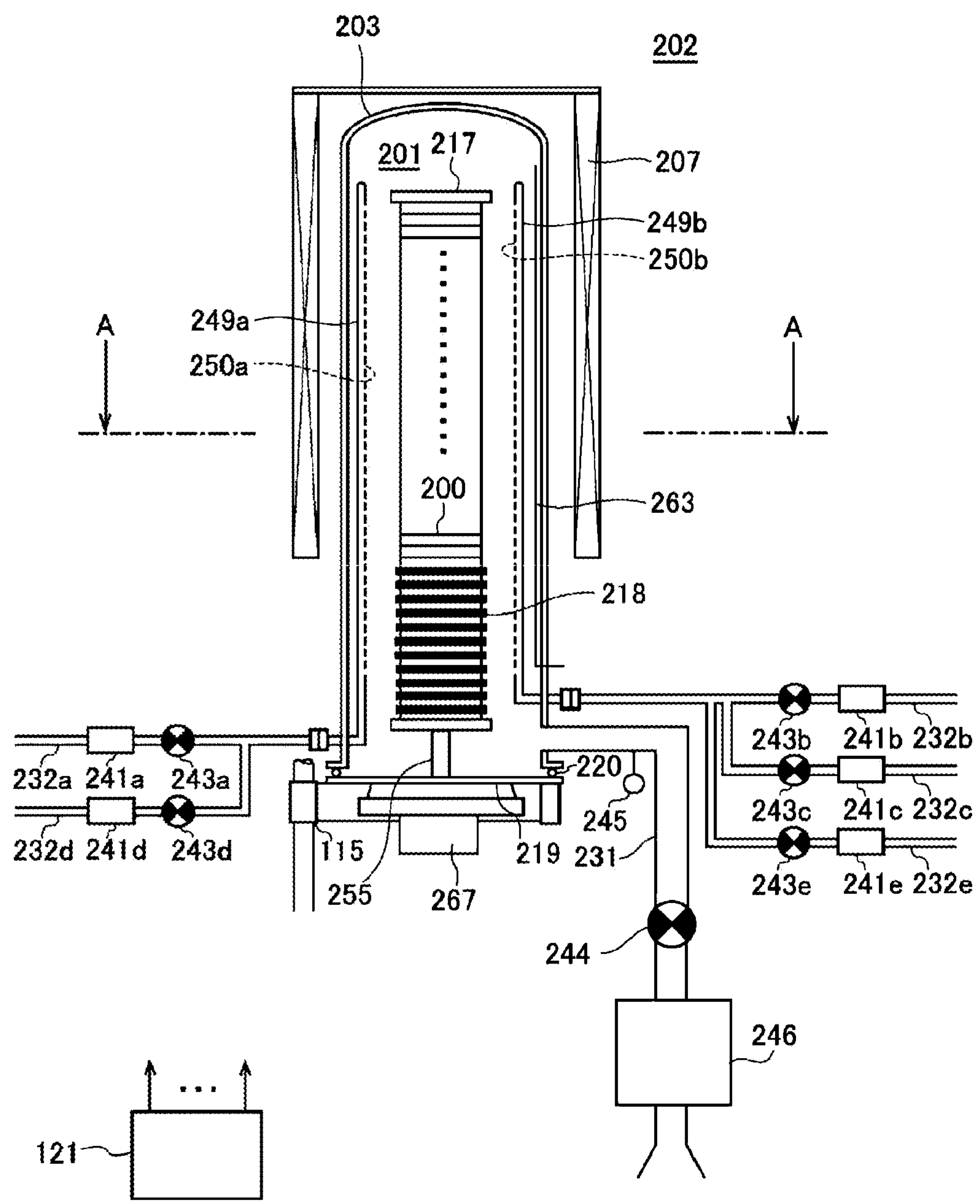
FIG. 1 schematically illustrates a configuration of a vertical processing furnace in a substrate processing apparatus that is appropriately employed in one embodiment of the present disclosure, in which a portion of the processing furnace is shown in a vertical cross section.
Figure 2:
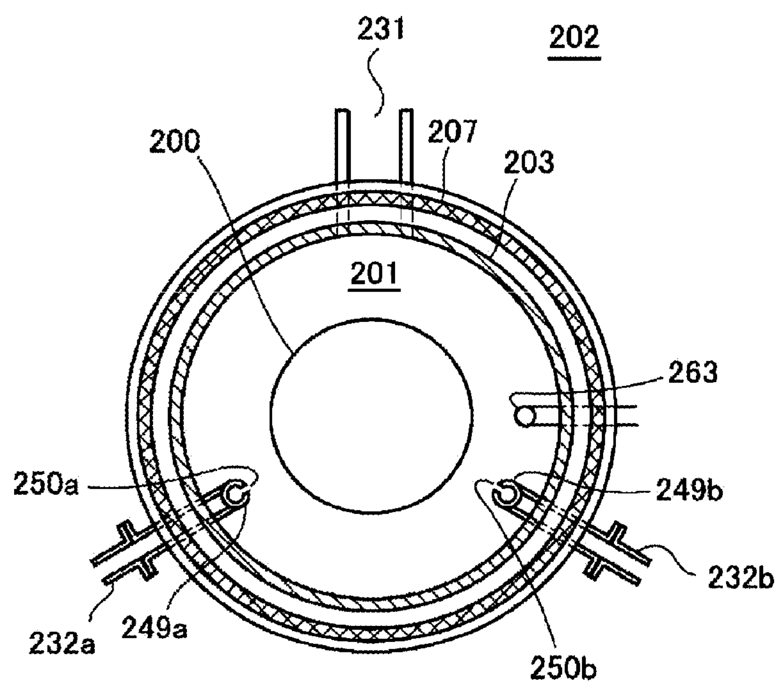
FIG. 2 schematically illustrates a configuration of the vertical processing furnace in the substrate processing apparatus that is appropriately employed in one embodiment of the present disclosure, in which a portion of the processing furnace is shown in a cross section taken along the line A-A in FIG. 1.

As illustrated in FIG. 1, a processing furnace 202 includes a heater 207 serving as a heating unit (i.e., a heating mechanism). The heater 207 has a cylindrical shape and is supported by a heater base (not shown) serving as a support plate so as to be vertically installed. As will be described later, the heater 207 functions as an activation mechanism (i.e., an excitation unit) configured to thermally activate (or excite) gas.

A reaction tube 203 constituting a reaction vessel (i.e., process vessel) is disposed in the heater 207 in a concentric relationship with the heater 207. The reaction tube 203 is made of heat resistant material such as quartz ($SiO_2$) or silicon carbide (SiC) and has a cylindrical shape with its upper end closed and its lower end opened. A process chamber 201 is formed in a hollow cylindrical portion of the reaction tube 203. The process chamber 201 is configured to accommodate a plurality of wafers 200 as substrates. The wafers 200 are horizontally stacked in multiple stages along a vertical direction in a boat 217, which will be described later.

Nozzles 249*a* and 249*b* are installed in the process chamber 201 to penetrate through a lower portion of the reaction tube 203. Gas supply pipes 232*a* and 232*b* are connected to the nozzles 249*a* and 249*b*, respectively. A gas supply pipe 232*c* is connected to the gas supply pipe 232*b*. In the manner as described above, the two nozzles 249*a* and 249*b* and the three gas supply pipes 232*a* to 232*c* are installed to the reaction tube 203 and are configured to supply plural kinds of gases into the process chamber 201.

However, the processing furnace 202 of the present embodiment is not limited to the configuration as described above. For example, a manifold made of metal and configured to support the reaction tube 203 may be installed under the reaction tube 203. Each of the nozzles may be installed to penetrate through a sidewall of the manifold. In this case, an exhaust pipe 231, which will be described later, may be further installed in the manifold. Alternatively, the exhaust pipe 231 may be installed to a lower portion of the reaction tube 203, rather than the manifold. A furnace opening portion of the processing furnace 202 may be made of metal and the nozzles and the like may be installed to the metal-made furnace opening portion.

Mass flow controllers (MFC) 241*a* to 241*c*, which are flow rate controllers (i.e., flow rate control units), and valves 243*a* to 243*c*, which are opening/closing valves, are sequentially installed in the gas supply pipes 232*a* to 232*c* from corresponding upstream sides. Gas supply pipes 232*d* and 232*e* which supply an inert gas are connected, respectively, to the gas supply pipes 232*a* and 232*b* at more downstream sides than the valves 243*a* and 243*b*. Mass flow controllers (MFC) 241*d* and 241*e*, which are flow rate controllers (i.e., flow rate control units), and valves 243*d* and 243*e*, which are opening/closing valves, are sequentially installed to the gas supply pipes 232*d* and 232*e* from corresponding upstream sides.

The nozzles 249*a* and 249*b* are connected to end portions of the gas supply pipes 232*a* and 232*b*, respectively. As illustrated in FIG. 2, the nozzles 249*a* and 249*b* are disposed in an annular space between an inner wall of the reaction tube 203 and the wafers 200 such that the nozzles 249*a* and 249*b* extend upward along a stacked direction of the wafers 200 from a lower portion of the inner wall of the reaction tube 203 to an upper portion thereof. Specifically, the nozzles 249*a* and 249*b* are installed along a wafer arrangement region in which the wafers 200 are arranged and in a region that horizontally surrounds the wafer arrangement region at a side of the wafer arrangement region. The nozzles 249*a* and 249*b* are configured as L-shaped nozzles, and their horizontal portions are installed to penetrate a lower sidewall of the reaction tube 203 while their vertical portions are installed to ascend at least from one end portion to the other end portion of the wafer arrangement region. Gas supply holes 250*a* and 250*b* for supplying gas are formed on side surfaces of the nozzles 249*a* and 249*b*, respectively. Each of the gas supply holes 250*a* and 250*b* are opened toward a center of the reaction tube 203 to allow the gas to be supplied toward the wafers 200. A plurality of gas supply holes 250*a* and a plurality of gas supply holes 250*b* may be installed at a predetermined opening pitch from a lower portion to an upper portion of the reaction tube 203. An opening area of each of the gas supply holes 250*a* and 250*b* may be identical.

As described above, in the present embodiment, gas is transferred through the nozzles 249*a* and 249*b* which are disposed in the vertically-elongated annular space, that is, a cylindrical space, defined by the inner wall of the reaction tube 203 and end portions of the stacked wafers 200. The gas is initially injected into the reaction tube 203, near the wafers 200, through the gas supply holes 250*a* and 250*b* formed in the nozzles 249*a* and 249*b*. Accordingly, the gas supplied into the reaction tube 203 mainly flows within the reaction tube 203 in a direction parallel to surfaces of the wafers 200, that is, a horizontal direction. According to the above configuration, the gas can be uniformly supplied to the respective wafers 200, which makes a thickness of a thin film formed on each of the wafers 200 uniform. In addition, the gas flowing over the surfaces of the wafers 200 after reaction (i.e., residual gas) flows toward an exhaust port (i.e., the exhaust pipe 231) which will be described later. However, the flow direction of the residual gas is not limited to a vertical direction, but may be appropriately decided depending on a position of the exhaust port.

A precursor gas containing a predetermined element, carbon (C), and a halogen element and having a chemical bond of the predetermined element and C, for example, an alkylene halosilane precursor gas containing Si as the predetermined element, an alkylene group, and a halogen group and having a chemical bond of Si and C (i.e., Si—C bond); or an alkyl halosilane precursor gas containing Si, an alkyl group, and a halogen group and having a Si—C bond is supplied from the gas supply pipe 232*a* into the process chamber 201 through the MFC 241*a*, the valve 243*a*, and the nozzle 249*a*.

In this configuration, the alkylene group is a functional group obtained by removing two hydrogen (H) atoms from chain-shaped saturated hydrocarbon (alkane), which is denoted as a chemical formula $C_nH_{2n+2}$, and is an aggregate of atoms that are denoted as a chemical formula $C_nH_{2n}$. The alkylene group includes a methylene group, an ethylene group, a propylene group, a butylene group, or the like. The alkyl group is a functional group obtained by removing one H atom from chain-shaped saturated hydrocarbon, which is denoted as a chemical formula $C_nH_{2n+2}$, and is an aggregate of atoms that are denoted as a chemical formula $C_nH_{2n+1}$. The alkyl group includes a methyl group, an ethyl group, a propyl group, a butyl group, or the like. The halogen group includes a chloro group, a fluoro group, a bromo group, or the like. As such, the halogen group includes a halogen element such as chlorine (Cl), fluorine (F), bromine (Br), or the like.

As the alkylene halosilane precursor gas, it may be possible to use, for example, a precursor gas containing Si, a methylene group (—$CH_2$—) as an alkylene group, and a chloro group (Cl) as a halogen group (i.e., a chlorosilane precursor gas containing a methylene group); or a precursor gas containing Si, an ethylene group (—$C_2H_4$—) as an alkylene group, and a chloro group (Cl) as a halogen group (i.e., a chlorosilane precursor gas containing an ethylene group). As the chlorosilane precursor gas containing a methylene group, it may be possible to use, for example, a methylene bis(trichlorosilane) gas, i.e., a bis(trichlorosilyl) methane ($(SiCl_3)_2CH_2$, abbreviation: BTCSM) gas. As the chlorosilane precursor gas containing an ethylene group, it may be possible to use, for example, an ethylene bis(trichlorosilane) gas, i.e., a 1,2-bis(trichlorosilyl)ethane ($(SiCl_3)_2C_2H_4$, abbreviation: BTCSE) gas.

Figure 13A:
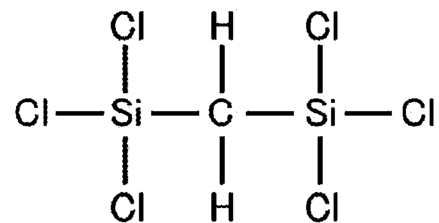
FIG. 13A illustrates a chemical structural formula of BTCSM.

As depicted in FIG. 13A, BTCSM contains one methylene group as an alkylene group in its chemical structural formula (in one molecule). Each of two dangling bonds of the methylene group is bonded to Si, such that a Si—C—Si bond is formed.

Figure 13B:
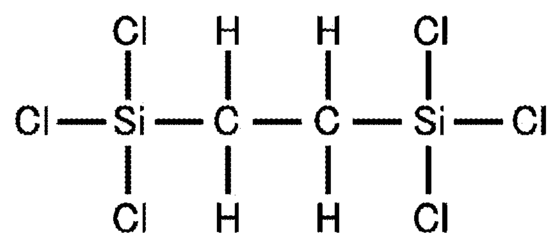
FIG. 13B illustrates a chemical structural formula of BTCSE.

As depicted in FIG. 13B, BTCSE contains one ethylene group as an alkylene group in one molecule. Each of two dangling bonds of the ethylene group is bonded to Si, such that a Si—C—C—Si bond is formed.

As the alky halosilane precursor gas, it may be possible to use, for example, a precursor gas containing Si, a methyl group (—$CH_3$) as an alkyl group, and a chloro group (Cl) as a halogen group (i.e., a chlorosilane precursor gas containing a methyl group). As the chlorosilane precursor gas containing a methyl group, it may be possible to use, for example, a 1,1,2,2-tetrachloro-1,2-dimethyldisilane ($(CH_3)_2Si_2Cl_4$, abbreviation: TCDMDS) gas; a 1,2-dichloro-1,1,2,2-tetramethyldisilane ($(CH_3)_4Si_2C_2$, abbreviation: DCTMDS) gas; a 1-monochloro-1,1,2,2,2-pentamethyldisilane ($(CH_3)_5Si_2Cl$, abbreviation: MCPMDS) gas; or the like. Unlike the alkylene halosilane precursor gas such as the BTCSE gas or the BTCSM gas, the alkyl halosilane precursor gas such as the TCDMDS gas, the DCTMDS gas, or the MCPMDS gas is a gas having a Si—Si bond, that is, a precursor gas containing a predetermined element and a halogen element and having a chemical bond between atoms of the predetermined element.

Figure 13C:
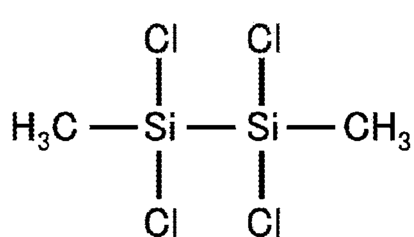
FIG. 13C illustrates a chemical structural formula of TCDMDS.

As depicted in FIG. 13C, TCDMDS contains two methyl groups as alkyl groups in one molecule. Each of dangling bonds of the two methyl groups is bonded to Si, such that Si—C bonds are formed. TCDMDS is a derivative of disilane, and has a Si—Si bond. As such, TCDMDS has a Si—Si—C bond in which Si and Si are bonded to each other, and Si is bonded to C.

Figure 13D:
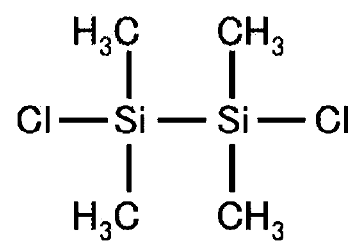
FIG. 13D illustrates a chemical structural formula of DCTMDS.

As depicted in FIG. 13D, DCTMDS contains four methyl groups as alkyl groups in one molecule. Each of the dangling bonds of the four methyl groups is bonded to Si, such that Si—C bonds are formed. DCTMDS is a derivative of disilane, and has a Si—Si bond. As such, DCTMDS has a Si—Si—C bond in which Si and Si are bonded to each, other and Si is bonded to C.

Figure 13E:
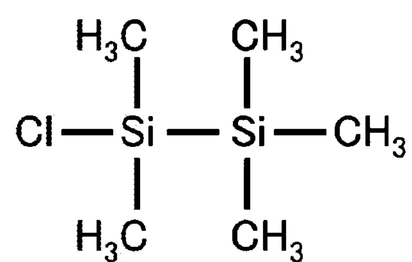
FIG. 13E illustrates a chemical structural formula of MCPMDS.

As depicted in FIG. 13E, MCPMDS contains five methyl groups as alkyl groups in one molecule. Each of the dangling bonds of the five methyl groups is bonded to Si, such that Si—C bonds are formed. MCPMDS is a derivative of disilane, and has a Si—Si bond. As such, MCPMDS has a Si—Si—C bond in which Si and Si are bonded to each other, and Si is bonded to C. Unlike BTCSM, BTCSE, TCDMDS, and DCTMDS, MCPMDS has an asymmetry structure in which the methyl groups and the chloro group surrounding Si are asymmetrically arranged in one molecule (in the chemical structural formula). As described above, in the present embodiment, it may be possible to use not only a precursor gas having a symmetric chemical structural formula as illustrated in FIGS. 13A to 13D but also a precursor gas having an asymmetric chemical structural formula.

The alkylene halosilane precursor gas such as the BTCSM gas or the BTCSE gas, or the alkyl halosilane precursor gas such as the TCDMDS gas, the DCTMDS gas, or the MCPMDS gas may be a precursor gas which contains at least two Si atoms in one molecule, contains C and Cl, and has Si—C bonds. In a substrate processing procedure, which will be described later, this gas acts as a Si source and a C source. The BTCSM gas and the BTCSE gas may be referred to as an alkylene chlorosilane precursor gas. The TCDMDS gas, the DCTMDS gas, and the MCPMDS gas may be referred to as an alkyl chlorosilane precursor gas.

In the present disclosure, the precursor gas refers to a precursor in a gaseous state, for example, a gas obtained by vaporizing a precursor which is in a liquid state under room temperature and atmospheric pressure, or a precursor which is in a gaseous state under room temperature and atmospheric pressure. When the term "precursor" is used herein, it may refer to "a liquid precursor in a liquid state," "a precursor gas in a gaseous state," or both of them. In the case of using a liquid precursor in a liquid state under room temperature and atmospheric pressure, such as BTCSM or the like, the liquid precursor is vaporized by a vaporization system, such as a vaporizer or a bubbler, and is supplied as a precursor gas (e.g., a BTCSM gas or the like).

A precursor gas containing a predetermined element, for example, a halosilane precursor gas containing Si as a predetermined element and a halogen element, is supplied from the gas supply pipe 232*a* into the process chamber 201 through the MFC 241*a*, the valve 243*a*, and the nozzle 249*a*.

The halosilane precursor is a silane precursor having a halogen group. The halogen group includes a chloro group, a fluoro group, a bromo group, an iodine group, and the like. As such, the halogen group includes a halogen element such as chlorine (Cl), fluorine (F), bromine (Br), iodine (I), or the like. The halosilane precursor may be one kind of halide.

As the halosilane precursor gas, for example, a precursor gas containing Si and Cl (i.e., a chlorosilane precursor gas). As the chlorosilane precursor gas, it may be possible to use, for example, a hexachlorodisilane ($Si_2Cl_6$, abbreviation: HCDS) gas. In the case of using a liquid precursor, such as HCDS or the like, which is in a liquid state under room temperature and atmospheric pressure, the liquid precursor is vaporized by a vaporization system such as a vaporizer or a bubbler, and is supplied as a precursor gas (e.g., an HCDS gas).

A reaction gas, for example, a nitrogen (N)-containing gas, which differs in chemical structure (e.g., molecular structure) from the precursor gas, may be supplied from the gas supply pipe 232*b* into the process chamber 201 through the MFC 241$b$, the valve 243$b$, and the nozzle 249$b$. As the nitrogen-containing gas, it may be possible to use, for example, a hydrogen nitride-based gas. In a substrate processing procedure, which will be described later, the nitrogen-containing gas acts as a nitriding gas, that is, an N source. As the hydrogen nitride-based gas, it may be possible to use, for example, an ammonia ($NH_3$) gas.

Furthermore, a reaction gas, for example, an oxygen (O)-containing gas, which differs in chemical structure from the precursor gas, may be supplied from the gas supply pipe 232$b$ into the process chamber 201 through the MFC 241$b$, the valve 243$b$, and the nozzle 249$b$. In a substrate processing procedure, which will be described later, the oxygen-containing gas acts as an oxidizing gas, that is, an O source. As the oxygen-containing gas, it may be possible to use, for example, an oxygen ($O_2$) gas.

Moreover, a reaction gas, for example, an N- and C-containing gas, which differs in chemical structure from the precursor gas, may be supplied from the gas supply pipe 232$b$ into the process chamber 201 through the MFC 241$b$, the valve 243$b$, and the nozzle 249$b$. As the N- and C-containing gas, it may be possible to use, for example, an amine-based gas.

The amine-based gas is gaseous amine, for example, a gas which is obtained by vaporizing amine which is in a liquid state under room temperature and atmospheric pressure or a gas which contains an amine group such as amine or the like which is in a gaseous state under room temperature and atmospheric pressure. The amine-based gas contains amine such as ethylamine, methylamine, propylamine, isopropylamine, butylamine, isobutylamine, or the like. As used herein, the term "amine" is a generic name of compounds in which a hydrogen atom in ammonia ($NH_3$) is substituted with a hydrocarbon group such as an alkyl group or the like. Amine contains a hydrocarbon group such as an alkyl group or the like as a ligand containing C atoms, i.e., an organic ligand. The amine-based gas may be referred to as a Si-free gas since it contains three elements C, N, and H while not containing Si. The amine-based gas may be referred to as a Si-free and metal-free gas since it does not contain Si and metal. The amine-based gas may be a substance consisting of only three elements C, N, and H. The amine-based gas acts as an N source and as a C source in a substrate processing procedure, which will be described later. The term "amine" as used herein refers to"amine in a liquid state," an "amine-based gas in a gaseous state," or both of them.

As the amine-based gas, it may be possible to use, for example, a triethylamine ($(C_2H_5)_3N$, abbreviation: TEA) gas, in which the number of C-containing ligands (i.e., ethyl group) in the chemical structural formula (in one molecule) is two or more and the number of C atoms in one molecule is larger than the number of N atoms. In the case of using amine such as TEA or the like which is in a liquid state under room temperature and atmospheric pressure, the amine in a liquid state is vaporized by a vaporization system such as a vaporizer or a bubbler, and is supplied as an N- and C-containing gas (e.g., a TEA gas).

A reaction gas, for example, a borazine-ring-skeleton-free boron-containing gas, which differs in chemical structure from the precursor gas, may be supplied from the gas supply pipe 232$b$ into the process chamber 201 through the MFC 241$b$, the valve 243$b$, and the nozzle 249$b$. As the borazine-ring-skeleton-free boron-containing gas, it may be possible to use, for example, a borane-based gas.

The borane-based gas refers to a borane compound in a gaseous state, for example, a gas obtained by vaporizing a borane compound in a liquid state under room temperature and atmospheric pressure, a borane compound in a gaseous state under room temperature and atmospheric pressure, or the like. The borane compound includes a haloborane compound containing B and a halogen element, for example, a chloroborane compound containing B and Cl. Further, the borane compound includes borane (borohydride) such as monoborane ($BH_3$), diborane ($B_2H_6$) or the like, or a borane compound (borane derivative) in which H of borane is substituted with another element or the like. The borane-based gas acts as a B source in a substrate processing procedure, which will be described later. As the borane-based gas, it may be possible to use, for example, a trichloroborane ($BCl_3$) gas. The $BCl_3$ gas is a boron-containing gas which does not contain a borazine compound, which will be described later, that is, a non-borazine-based boron-containing gas.

In addition, a reaction gas, for example, a borazine-ring-skeleton-containing gas, which differs in chemical structure from the precursor gas, may be supplied from the gas supply pipe 232$b$ into the process chamber 201 through the MFC 241$b$, the valve 243$b$, and the nozzle 249$b$. As the borazine-ring-skeleton-containing gas, it may be possible to use, for example, a gas containing a borazine ring skeleton and an organic ligand, that is, an organic borazine-based gas.

As the organic borazine-based gas, it may be possible to use, for example, a gas containing an alkyl borazine compound which is an organic borazine compound. The organic borazine-based gas may be referred to as a borazine compound gas or a borazine-based gas.

Figure 14A:
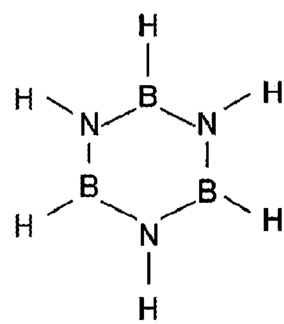
FIG. 14A illustrates a chemical structural formula of borazine.
Figure 14B:
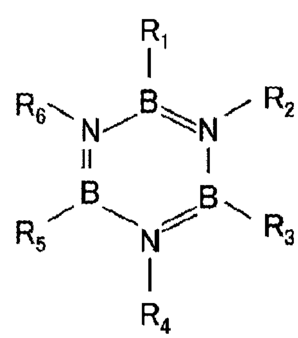
FIG. 14B illustrates a chemical structural formula of a borazine compound.

As used herein, borazine is a heterocyclic compound composed of three elements, B, N, and H. Borazine may be denoted as a composition formula of $B_3H_6N_3$ and may be denoted as a chemical structural formula illustrated in FIG. 14A. The borazine compound is a compound including a borazine ring skeleton (also referred to as a "borazine skeleton"), which constitutes a borazine ring containing three B atoms and three N atoms. The organic borazine compound is a borazine compound containing C, and may also be referred to as a borazine compound containing a C-containing ligand, i.e., an organic ligand. The alkyl borazine compound is a borazine compound containing an alkyl group and may be referred to as a borazine compound containing an alkyl group as an organic ligand. The alkyl borazine compound is a compound in which at least one of six H atoms contained in borazine is substituted with hydrocarbon containing one or more C atoms, and may be denoted as a chemical structural formula illustrated in FIG. 14B. In this case, each of $R_1$ to $R_6$ in the chemical structural formula in FIG. 14B is atom or an alkyl group containing one to four C atoms. $R_1$ to $R_6$ may be the same kind of an alkyl group or may be different kinds of alkyl groups. However, not all of $R_1$ to $R_6$ should be H. The alkyl borazine compound may refer to a substance including a borazine ring skeleton, which constitutes a borazine ring, and contains B N, H, and C. Further, the alkyl borazine compound may refer to a substance including a borazine ring skeleton and containing an alkyl ligand. In addition, each of $R_1$ to $R_6$ may be an H atom, or an alkenyl group or an alkynyl group containing one to four C atoms, $R_1$ to $R_6$ may be the same kind of an alkenyl group or an alkynyl group, or may be different kinds of alkenyl groups or alkynyl groups. However, not all of $R_1$ to $R_6$ should be H.

The borazine-based gas acts as a B source, a N source, and a C source in a substrate processing procedure, which will be described later.

Figure 14C:
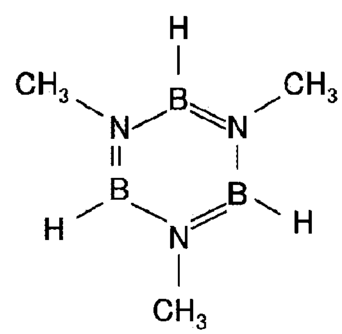
FIG. 14C illustrates a chemical structural formula of n,n',n"-trimethylborazine.
Figure 14D:
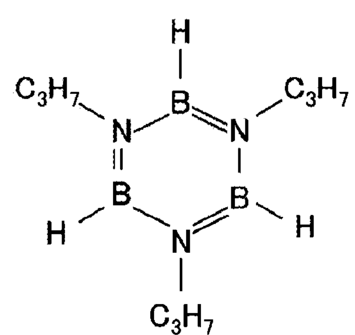
FIG. 14D illustrates a chemical structural formula of n,n',n"-tri-n-propylborazine.

As the borazine-based gas, it may be possible to use, for example, an n,n',n"-trimethylborazine (abbreviation: TMB) gas; an n,n',n"-triethylborazinea (abbreviation: TEB) gas; an n,n',n"-tri-n-propylborazine (abbreviation: TPB) gas; an n,n',n"-triisopropylborazine (abbreviation: TIPB) gas; an n,n',n"-tri-n-butylborazine (abbreviation: TBB) gas; an n,n', n"-triisobutylborazine (abbreviation: TIBB) gas, or the like. TMB is a borazine compound in which $R_1$, $R_3$, and $R_5$ of the chemical structural formula illustrated in FIG. 14B are H atoms while $R_2$, $R_4$, and $R_6$ of the chemical structural formula are methyl groups. TMB may be denoted as a chemical structural formula illustrated in FIG. 14C. TEB is a borazine compound in which $R_1$, $R_3$, and $R_5$ of the chemical structural formula illustrated in FIG. 14B are H atoms while $R_2$, $R_4$, and $R_6$ of the chemical structural formula are ethyl groups. TPB is a borazine compound in which $R_1$, $R_3$, and $R_5$ of the chemical structural formula illustrated in FIG. 14B are H atoms while $R_2$, $R_4$, and $R_6$ of the chemical structural formula are propyl groups. TPB may be denoted as a chemical structural formula illustrated in FIG. 14D. TIPB is a borazine compound in which $R_1$, $R_3$, and $R_5$ of the chemical structural formula illustrated in FIG. 14B are H atoms while $R_2$, $R_4$, and $R_6$ of the chemical structural formula are isopropyl groups. TIBB is a borazine compound in which $R_1$, $R_3$, and $R_5$ of the chemical structural formula illustrated in FIG. 14B are H atoms while $R_2$, $R_4$, and $R_6$ of the chemical structural formula are isobutyl groups.

In the case of using a borazine compound such as TMB or the like, which is in a liquid state under room temperature and atmopspheric pressure, the borazine compound in a liquid state is vaporized by a vaporization system such as a vaporizer or a bubbler, and is supplied as a borazine-based gas (e.g., a TMB gas).

A reaction gas, for example, a carbon-containing gas, which differs in chemical structure from the precursor gas, may be supplied from the gas supply pipe 232*c* into the process chamber 201 through the MFC 241*c*, the valve 243*c*, the gas supply pipe 232*b*, and the nozzle 249*b*. As the carbon-containing gas, it may be possible to use, for example, a hydrocarbon-based gas. The hydrocarbon-based gas may be a substance consisting of only two elements C and H. The hydrocarbon-based gas acts as a C source in a substrate processing procedure, which will be described later. As the hydrocarbon-based gas, it may be possible to use, for example, a propylene ($C_3H_6$) gas.

An inert gas, for example, a nitrogen ($N_2$) gas, is supplied from the gas supply pipes 232*d* and 232*e* into the process chamber 201 through the MFCs 241*d* and 241*e*, the valves 243*d*, and 243*e*, the gas supply pipes 232*a* and 232*b*, and the nozzles 249*a* and 249*b*.

In the case of supplying the above-described precursor gas from the gas supply pipe 232*a*, a precursor gas supply system mainly includes the gas supply pipe 232*a*, the MFC 241*a*, and the valve 243*a*. The precursor gas supply system may also include the nozzle 249*a*. The precursor gas supply system may be referred to as a precursor supply system. In the case of supplying an alkyl halosilane precursor gas from the gas supply pipe 232*a*, the precursor gas supply system may be referred to as an alkyl halosilane precursor gas supply system or an alkyl halosilane precursor supply system. In the case of supplying an alkylene halosilane precursor gas from the gas supply pipe 232*a*, the precursor gas supply system may be referred to as an alkylene halosilane precursor gas supply system or an alkylene halosilane precursor supply system. In the case of supplying a halosilane precursor gas from the gas supply pipe 232*a*, the precursor gas supply system may be referred to as a halosilane precursor gas supply system or a halosilane precursor supply system.

In the case of supplying a nitrogen-containing gas from the gas supply pipe 232*b*, a nitrogen-containing gas supply system mainly includes the gas supply pipe 232*b*, the MFC 241*b*, and the valve 243*b*. The nitrogen-containing gas supply system may also include the nozzle 249*b*. The nitrogen-containing gas supply system may be referred to as a nitriding gas supply system or a nitriding agent supply system. In the case of supplying a hydrogen nitride-based gas from the gas supply pipe 232*b*, the nitrogen-containing gas supply system may be referred to as a hydrogen nitride-based gas supply system or a hydrogen nitride supply system.

In the case of supplying an oxygen-containing gas from the gas supply pipe 232*b*, an oxygen-containing gas supply system mainly includes the gas supply pipe 232*b*, the MFC 241*b*, and the valve 243*b*. The oxygen-containing gas supply system may also include the nozzle 249*b*. The oxygen-containing gas supply system may be referred to as an oxidizing gas supply system or an oxidizing agent supply system.

In the case of supplying an N- and C-containing gas from the gas supply pipe 232*b*, a nitrogen- and carbon-containing gas supply system mainly includes the gas supply pipe 232*b*, the MFC 241*b*, and the valve 243*b*. The nitrogen- and carbon-containing gas supply system may also include the nozzle 249*b*. In the case of supplying an amine-based gas from the gas supply pipe 232*b*, the nitrogen- and carbon-containing gas supply system may be referred to as an amine-based gas supply system or an amine supply system. The N- and C-containing gas is a nitrogen-containing gas or a carbon-containing gas. Thus, a nitrogen-containing gas supply system or a carbon-containing gas supply system, which will be described later, may include the nitrogen- and carbon-containing gas supply system.

In the case of supplying a boron-containing gas from the gas supply pipe 232*b*, a boron-containing gas supply system mainly includes the gas supply pipe 232*b*, the MFC 241*b*, and the valve 243*b*. The boron-containing gas supply system may also include the nozzle 249*b*. In the case of supplying a borane-based gas from the gas supply pipe 232*b*, the boron-containing gas supply system may be referred to as a borane-based gas supply system or a borane compound supply system. In the case of supplying a borazine-based gas from the gas supply pipe 232*b*, the boron-containing gas supply system may be referred to as a borazine-based gas supply system, an organic borazine-based gas supply system, or a borazine compound supply system. The borazine-based gas is an N- and C-containing gas, which is also a nitrogen-containing gas or a carbon-containing gas. Thus, a nitrogen- and carbon-containing gas supply system, a nitrogen-containing gas supply system, or a carbon-containing gas supply system may include the borazine-based gas supply system.

In the case of supplying a carbon-containing gas from the gas supply pipe 232*c*, a carbon-containing gas supply system mainly includes the gas supply pipe 232*c*, the MFC 241*c* and the valve 243*c*. The carbon-containing gas supply system may also include the nozzle 249*b* disposed at a more downstream side of a connection portion of the gas supply pipe 232*b* and the gas supply pipe 232*c*. In the case of supplying a hydrocarbon-based gas from the gas supply pipe 232*c*, the carbon-containing gas supply system may be referred to as a hydrocarbon-based gas supply system or a hydrocarbon supply system.

One or all of the nitrogen-containing gas supply system, the oxygen-containing gas supply system, the nitrogen- and carbon-containing gas supply system, the boron-containing gas supply system, and the carbon-containing gas supply system may be referred to as a reaction gas supply system.

An inert gas supply system mainly includes the gas supply pipes 232*d* and 232*e*, the MFCs 241*d* and 241*e*, and the valves 243*d* and 243*e*. The inert gas supply system may be referred to as a purge gas supply system or a carrier gas supply system.

An exhaust pipe 231 for exhausting an internal atmosphere of the process chamber 201 is installed to the reaction tube 203. A vacuum exhaust device, for example, a vacuum pump 246, is connected to the exhaust pipe 231 via a pressure sensor 245, which is a pressure detector (i.e., pressure detecting unit) for detecting an internal pressure of the process chamber 201, and an APC (Auto Pressure Controller) valve 244, which is a pressure regulator (i.e., pressure regulating unit). The APC valve 244 is configured to perform or stop vacuum exhaust in the process chamber 201 by opening or closing the valve while the vacuum pump 246 is actuated and is also configured to regulate the internal pressure of the process chamber 201 by adjusting an opening degree of the valve pursuant to pressure information detected by the pressure sensor 245 while the vacuum pump 246 is actuated. An exhaust system mainly includes the exhaust pipe 231, the APC valve 244, and the pressure sensor 245. The exhaust system may also include vacuum pump 246. In addition, the APC valve 244 constitutes a part of an exhaust flow path of the exhaust system. The APC valve 244 serves not only as a pressure regulator but also as an exhaust flow path opening/closing unit, that is, an exhaust valve, which can block and seal the exhaust flow path of the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, for example, stainless steel or the like, and is formed in a disc shape. An O-ring 220, which is a seal member making contact with the lower end portion of the reaction tube 203, is installed on an upper surface of the seal cap 219. A rotation mechanism 267 configured to rotate a boat 217, which will be described later, is installed at a side of the seal cap 219 opposite to the process chamber 201. A rotation shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. As such, the boat elevator 115 is configured as a transfer device (i.e., transfer mechanism) that transfers the boat 217, ultimately, the wafers 200, into and out of the process chamber 201.

The boat 217 serving as a substrate support is configured to support a plurality of wafers 200, for example, 25 to 200 wafers, in such a state that the wafers 200 are arranged in a horizontal posture and in multiple stages along a vertical direction, with the centers of the wafers 200 concentrically aligned, to be spaced-apart from one another. The boat 217 is made of heat resistant material such as quartz or SiC. Heat insulating plates 218 made of heat resistant material such as quartz or SiC are installed below the boat 217 in a horizontal posture and in multiple stages. With the above configuration, it is hard for heat generated from the heater 207 to be transferred to the seal cap 219. However, the present embodiment is not limited to the above-described configuration. For example, instead of installing the heat insulating plates 218 below the boat 217, a heat insulating tube as a tubular member made of heat resistant material such as quartz or SiC may be installed below the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249*a* and 249*b*, the temperature sensor 263 is formed in an L-shape. The temperature sensor 263 is installed along the inner wall of the reaction tube 203.

Figure 3:
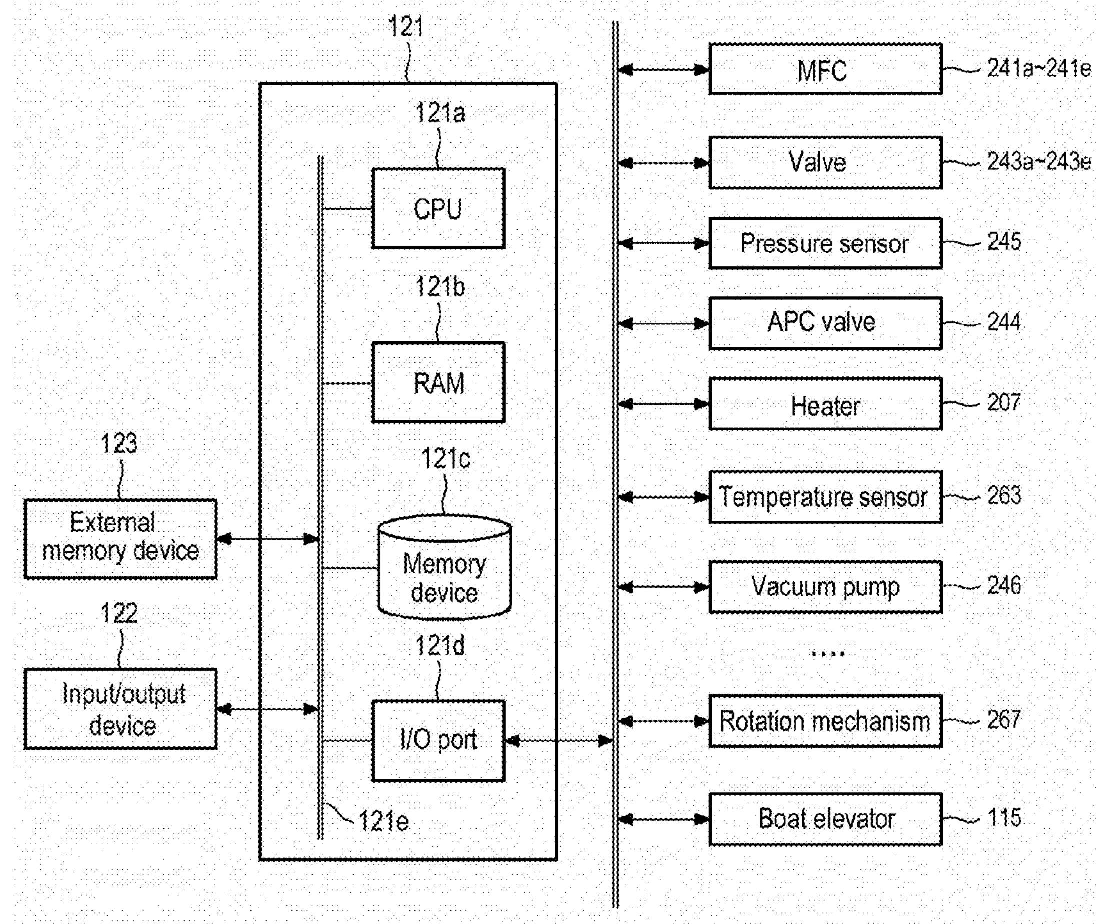
FIG. 3 schematically illustrates a configuration view of a controller of the substrate processing apparatus that is appropriately employed in one embodiment of the present disclosure, in which a control system of the controller is shown in a block diagram.

As illustrated in FIG. 3, a controller 121, which is a control unit (or control part), may be configured as a computer including a central processing unit (CPU) 121*a*, a random access memory (RAM) 121*b*, a memory device 121*c*, and an I/O port 121*d*. The RAM 121*b*, the memory device 121*c*, and the I/O port 121*d* are configured to exchange data with the CPU 121*a* via an internal bus 121*e*. An input/output device 122 formed, for example, of a touch panel or the like, is connected to the controller 121.

The memory device 121*c* is configured with, for example, a flash memory, a hard disc drive (HDD), or the like. A control program for controlling operations of a substrate processing apparatus or a process recipe, in which a sequence or condition for processing a substrate to be described later is written, is readably stored in the memory device 121*c*. Also, the process recipe functions as a program for the controller 121 to execute each sequence in the substrate processing procedure, which will be described later, to obtain a predetermined result. Hereinafter, such a process recipe or control program may be generally referred to as "a program." Also, when the term "program" is used herein, it may indicate a case of including only a process recipe, a case of including only a control program, or a case of including both a process recipe and a control program. In addition, the RAM 121*b* is configured as a memory area (or a work area) in which a program or data read by the CPU 121*a* is temporarily stored.

The I/O port 121*d* is connected to the MFCs 241*a* to 241*e*, the valves 243*a* to 243*e*, the pressure sensor 245, the APC valve 244, the vacuum pump 246, the heater 207, the temperature sensor 263, the rotation mechanism 267, the boat elevator 115, and the like.

The CPU 121*a* is configured to read and execute the control program from the memory device 121*c*. The CPU 121*a* also reads the process recipe from the memory device 121*c* according to an input of an operation command from the input/output device 122. In addition, the CPU 121*a* is configured to control the flow rate adjusting operation of various kinds of gases by the MFCs 241*a* to 241*e*, the opening/closing operation of the valves 243*a* to 243*e*, the opening/closing operation of the APC valve 244, the pressure regulating operation by the APC valve 244 based on the pressure sensor 245, the start/stop operation of the vacuum pump 246, the temperature adjusting operation by the heater 207 based on the temperature sensor 263, the rotation and rotation speed adjusting operation of the boat 217 by the rotation mechanism 267, the elevation operation of the boat 217 by the boat elevator 115, and the like, according to contents of the read process recipe.

Moreover, the controller 121 is not limited to being configured as a dedicated computer but may be configured as a general-purpose computer. For example, the controller 121 according to the present embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, means for providing the program to the computer is not limited to the case in which the program is provided through the external memory device 123. For example, the program may be supplied using communication means such as the Internet or a dedicated line, rather than through the external memory device 123. Also, the memory device 121*c* or the external memory device 123 is configured as a non-transitory computer-readable recording medium. Hereinafter, the means for supplying the program will be simply referred to as a "recording medium." In addition, when the term "recording medium" is used herein, it may include a case of including only the memory device 121*c*, a case of including only the external memory device 123, or a case of including both the memory device 121*c* and the external memory device 123

(2) Substrate Processing Procedure

An example of a procedure for forming a thin film on a substrate, which is one of the procedures for manufacturing a semiconductor device by using the above described substrate processing apparatus, is described below with reference to FIG. 4. In the following descriptions, the operations of the respective units or parts constituting the substrate processing apparatus are controlled by the controller 121.

Figure 4:
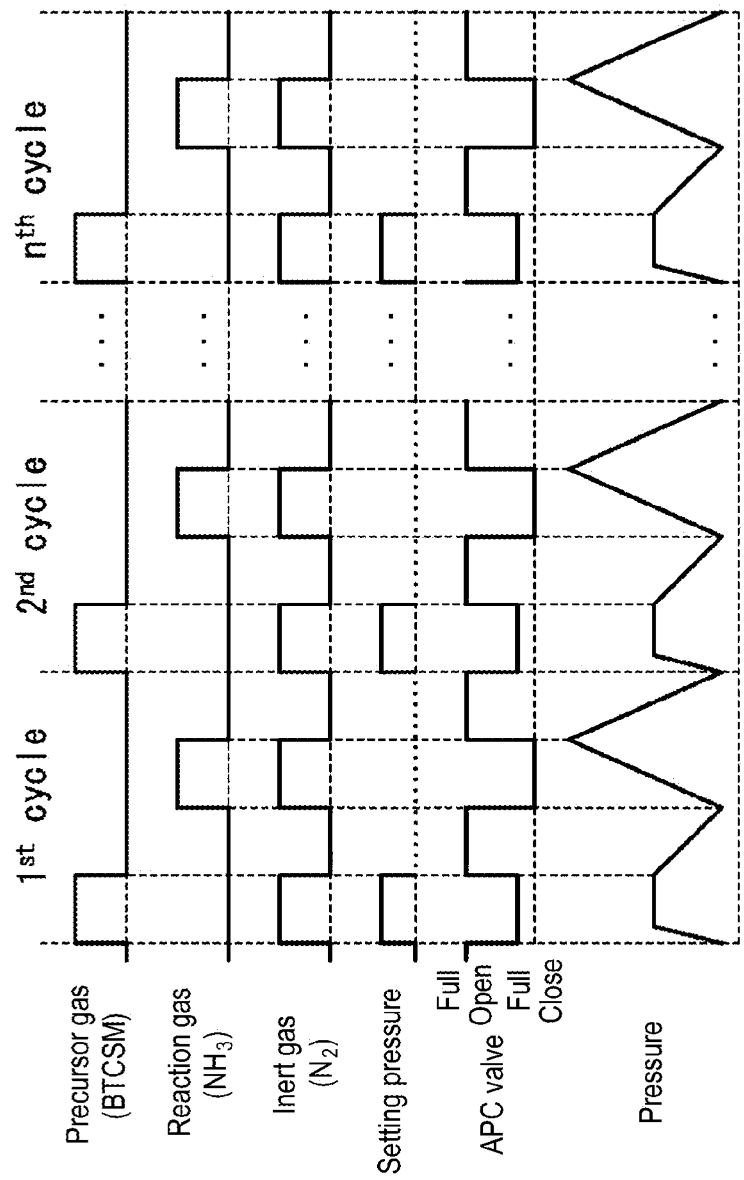
FIG. 4 illustrates gas supply timings and change of an internal pressure of a process chamber in a film forming sequence according to one embodiment of the present disclosure.

In a film forming sequence as illustrated in FIG. 4, a silicon carbonitride film (SiCN film) is formed on a wafer 200 as a substrate disposed in the process chamber 201 by performing a predetermined number of times (e.g., n times) a cycle that non-simultaneously (i.e., without synchronization) performs a step of supplying a BTCSM gas as a precursor gas to the wafer 200; a step of exhausting the BTCSM gas in the process chamber 201 through the exhaust system; a step of supplying an $NH_3$ gas as a reaction gas differing in chemical structure from the BTCSM gas to the wafer 200 and confining the $NH_3$ gas in the process chamber 201 while the exhaust system is closed; and a step of exhausting the $NH_3$ gas in the process chamber 201 through the exhaust system while the exhaust system is opened.

In the above operation, a target pressure (i.e., to-be-reached pressure) provided in the process chamber 201 at the step of confining the $NH_3$ gas in the process chamber 201 is set to be higher than a target pressure provided in the process chamber 201 at the step supplying the BTCSM gas. The "pressure" illustrated in FIG. 4 is an internal pressure (i.e., total pressure) of the process chamber 201 indicated with an arbitrary unit (a.u.). In the "set pressure" illustrated in FIG. 4, the interval indicated with a dot line refers to an interval in which the APC valve 244 is fully opened or fully closed. As such, the period indicated with the dot line refers to a period in which the internal pressure of the process chamber 201 is not controlled, that is, the APC valve 244 is not feedback-controlled.

To control the internal pressure, in the film forming sequence shown in FIG. 4, as an example, the opening degree of the exhaust flow path of the exhaust system at the step of confining the $NH_3$ gas in the process chamber 201 is set to be smaller than the opening degree of the exhaust flow path at the step of supplying the BTCSM gas. Specifically, at the step of confining the $NH_3$ gas in the process chamber 201, the APC valve 244 installed in the exhaust system is fully closed so as to completely close the exhaust flow path of the exhaust system with no gap, that is, so as to seal the exhaust system. For example, in the film forming sequence shown in FIG. 4, at the step of confining the $NH_3$ gas in the process chamber 201, the $NH_3$ gas is continuously supplied into the process chamber 201 such that the internal pressure of the process chamber 201 continues to increase.

As used herein, the phrase "performing a cycle a predetermined number of times" means that that the cycle is performed once or a plurality of times. In other words, the phrase may also mean that the cycle is performed one or more times. FIG. 4 illustrates an example in which the cycle is repeated n times.

As used herein, the term "wafer" may refer to "a wafer itself" or "a wafer and a laminated body (a collected body) of predetermined layers or films formed on a surface of the wafer" (i.e., a wafer including predetermined layers or films formed on its surface may be referred to as a wafer). In addition, as used herein, the phrase "a surface of a wafer" may refer to "a surface (or an exposed surface) of a wafer itself" or "a surface of a predetermined layer or film formed on a wafer, i.e., an uppermost surface of the wafer, which is a laminated body."

As such, as used herein, the phrase "a predetermined gas is supplied to a wafer" may mean that "a predetermined gas is directly supplied to a surface (or an exposed surface) of a wafer itself" or that "a predetermined gas is supplied to a layer or a film formed on a wafer, i.e., on an uppermost surface of a wafer as a laminated body." Also, as used herein, the phrase "a predetermined layer (or film) is formed on a wafer" may mean that "a predetermined layer (or film) is directly formed on a surface (or an exposed surface) of a wafer itself" or that "a predetermined layer (or film) is formed on a layer or a film formed on a wafer, i.e., on an uppermost surface of a wafer as a laminated body."

In addition, the term "substrate" as used herein may be synonymous with the term "wafer" and, in this case, the terms "wafer" and "substrate" may be used interchangeably in the above descriptions.

(Wafer Charge and Boat Load)

When the plurality of wafers 200 is charged on the boat 217 (i.e., wafer charge), as illustrated in FIG. 1, the boat 217 supporting the plurality of wafers 200 is lifted by the boat elevator 115 and is loaded into the process chamber 201 (i.e., boat load). In this state, the seal cap 219 seals the lower end of the reaction tube 203 through the O-ring 220.

(Pressure Adjustment and Temperature Adjustment)

An internal pressure of the process chamber 201, that is, of the space in which the wafers 200 exist is vacuum-exhausted (i.e., pressure-reducing exhaust) by the vacuum pump 246 to reach a desired pressure (or a desired vacuum level). In this operation, the internal pressure of the process chamber 201 is measured by the pressure sensor 245. The APC valve 244 is feedback-controlled based on the measured pressure information. The vacuum pump 246 may be continuously activated at least until the processing on the wafers 200 is completed. The wafers 200 in the process chamber 201 are heated by the heater 207 to a desired temperature. In this operation, the state of supplying electric power to the heater 207 is feedback-controlled based on temperature information detected by the temperature sensor 263 such that the interior of the process chamber 201 reaches a desired temperature distribution. In addition, the heating of the interior of the process chamber 201 by the heater 207 may be continuously performed at least until the processing on the wafers 200 is completed. The boat 217 and the wafers 200 begin to be rotated by the rotation mechanism 267. Furthermore, the rotation of the boat 217 and the wafers 200 by the rotation mechanism 267 may be continuously performed at least until the processing on the wafers 200 is completed.

(SiCN Film Forming Procedure)

Next, the following two steps, i.e., Steps 1 and 2, are sequentially performed.

[Step 1]

(BTCSM Gas Supply)

While the APC valve 244 is opened at a predetermined opening degree, the valve 243*a* is opened to flow a BTCSM gas through the gas supply pipe 232*a*. A flow rate of the BTCSM gas is adjusted by the MFC 241*a*. The flow rate-adjusted BTCSM gas is supplied through the gas supply holes 250*a* into the process chamber 201, and is exhausted through the exhaust pipe 231. As such, the BTCSM gas is supplied to the wafers 200. In this operation, the valve 243*d* is opened to flow a $N_2$ gas through the gas supply pipe 232*d*. A flow rate of the $N_2$ gas is adjusted by the MFC 241*d*. The flow rate-adjusted $N_2$ gas is supplied into the process chamber 201 together with the BTCSM gas, and is exhausted through the exhaust pipe 231.

In order to prevent infiltration of the BTCSM gas into the nozzle 249*b*, the valve 243*e* is opened to flow a $N_2$ gas to flow through the gas supply pipe 232*e*. The $N_2$ gas is supplied into the process chamber 201 through the gas supply pipe 232*b* and the nozzle 249*b*, and is exhausted through the exhaust pipe 231.

In the above operation, the supply flow rate of the BTCSM gas controlled by the MFC 241*a* is set to fall within a range, for example, of 1 to 2,000 sccm, specifically, 10 to 1,000 sccm. The supply flow rate of the $N_2$ gas controlled by the MFC 241*d* or 241*e* is set to fall within a range, for example, of 100 to 10,000 sccm. As the BTCSM gas is supplied into the process chamber 201, the internal pressure of the process chamber 201 begins to increase. Thereafter, if the internal pressure of the process chamber 201 reaches a predetermined pressure within a range, for example, of 1 to 2,666 Pa, specifically, 67 to 1,333 Pa, the opening degree of the APC valve 244 is appropriately adjusted such that the internal pressure of the process chamber 201 is maintained to be constant. A time period for supplying the BTCSM gas into the process chamber 201, in other words, a gas supply time (i.e., an irradiation time) for the wafers 200, is set to fall within a range, for example, of 1 to 120 seconds, specifically, 1 to 60 seconds. A temperature of the heater 207 is set such that a temperature of the wafers 200 falls within a range, for example, of 400 to 800 degrees C., specifically, 500 to 700 degrees C., more specifically, 600 to 700 degrees C.

When the temperature of the wafers 200 is less than 400 degrees C., it is hard for BTCSM to be chemically adsorbed onto the wafers 200, and thus, a practical film forming rate may not be obtained. This problem can be solved by increasing the temperature of the wafers 200 to be 400 degrees C. or higher. By setting the temperature of the wafers 200 to be 500 degrees C. or higher, BTCSM can be sufficiently adsorbed onto the wafers 200, which may lead to obtaining a considerably sufficient film forming rate. By setting the temperature of the wafers 200 to be 600 degrees C. or higher, more specifically, 650 degrees C. or higher, BTCSM gas can be more sufficiently adsorbed onto the wafers 200, which may lead to obtaining a higher film forming rate.

If the temperature of the wafers 200 exceeds 800 degrees C., a CVD reaction becomes intensive (in other words, a gas phase reaction becomes dominant). Thus, film thickness uniformity may be hard to control and often deteriorate. By setting the temperature of the wafers 200 to be 800 degrees C. or lower, such deterioration of the film thickness uniformity can be suppressed and, thus, the film thickness uniformity can be controlled. In particular, a surface reaction becomes dominant by setting the temperature of the wafers 200 to be 700 degrees C. or lower and, thus, it becomes possible to secure the film thickness uniformity and control the film thickness uniformity.

Accordingly, the temperature of the wafers 200 may be set to fall within a range of 400 to 800 degrees C., specifically, 500 to 700 degrees C., more specifically, 600 to 700 degrees C. The BTCSM gas is low in degradability (or low in reactivity) and a pyrolysis temperature of the BTCSM gas is high. Therefore, even if a film is formed in a relatively high temperature zone, for example, of 650 to 800 degrees C., it is possible to suppress generation of an excessive gas phase reaction and to suppress resultant generation of particles.

By supplying the BTCSM gas to the wafers 200 under the above conditions, a first layer, for example, a Si-containing layer containing C and Cl and having a thickness, for example, of less than one atomic layer to several atomic layers is formed on the wafer 200 (or a base film of its surface). The Si-containing layer containing C and Cl is a layer including a Si—C bond. The Si-containing layer containing C and Cl may be a Si layer containing C and Cl, an adsorption layer of the BTCSM gas, or both of them.

Herein, the phrase "a Si layer containing C and Cl" is a generic name which encompasses a continuous layer and a discontinuous layer that are formed of Si and contain C and Cl, and a Si thin film containing C and Cl which is formed by laminating the above layers. The continuous layer that is formed of Si and contains C and Cl may be referred to as a Si thin film containing C and Cl. In addition, Si that constitutes the Si layer containing C and Cl includes Si whose bond to C and Cl is completely broken, in addition to Si whose bond to C and Cl is not completely broken.

An adsorption layer of the BTCSM gas includes a continuous adsorption layer in which gas molecules of the BTCSM gas are continuous, and a discontinuous adsorption layer in which gas molecules of the BTCSM gas are discontinuous. In other words, the adsorption layer of the BTCSM gas may include an adsorption layer formed of BTCSM molecules and having a thickness of one molecular layer or less than one molecular layer. The BTCSM molecules that constitute the adsorption layer of the BTCSM gas include a molecule in which a bond between Si and C is partially broken and a molecule in which a bond between Si and Cl is partially broken. As such, the adsorption layer of the BTCSM gas may include a physical adsorption layer of the BTCSM gas, a chemical adsorption layer of the BTCSM gas, or both of them.

Herein, a layer having a thickness of less than one atomic layer refers to a discontinuously formed atomic layer. A layer having a thickness of one atomic layer refers to a continuously formed atomic layer. A layer having a thickness of less than one molecular layer refers to a discontinuously formed molecular layer. A layer having a thickness of one molecular layer refers to a continuously formed molecular layer. A Si-containing layer containing C and Cl may include both a Si layer containing C and Cl and an adsorption layer of a BTCSM gas. As described above, the Si-containing layer containing C and Cl is described with the terms such as “one atomic layer,” “several atomic layers,” and the like.

Under a condition in which the BTCSM gas is autolyzed (or pyrolyzed), that is, a condition in which a pyrolysis reaction of the BTCSM gas occurs, Si is deposited on the wafer 200 to form the Si layer containing C and Cl. Under a condition in which the BTCSM gas is not autolyzed (or pyrolyzed), that is, a condition in which a pyrolysis reaction of the BTCSM gas does not occur, the BTCSM gas is adsorbed onto the wafer 200 to form an adsorption layer of the BTCSM gas. In any of the above conditions, at least a portion of the Si—C bonds in the BTCSM gas are maintained to be unbroken and are introduced into the Si-containing layer containing C and Cl (i.e., the Si layer containing C and Cl or the adsorption layer of the BTCSM gas). For example, although one of the Si—C bonds, which constitute a Si—C—Si bond in the BTCSM gas, is broken, the other Si—C bond may be maintained to be unbroken and introduced into the Si layer containing C and Cl. From the viewpoint of increasing a film forming rate, it may be more advantageous to form the Si layer containing C and Cl on the wafer 200 than to form the adsorption layer of the BTCSM gas on the wafer 200.

If a thickness of the first layer formed on the wafer 200 exceeds several atomic layers, an effect of a modification reaction at following Step 2, which will be described later, is not to be applied to the entire first layer. On the other hand, a minimum value of the thickness of the first layer to be formed on the wafer 200 is less than one atomic layer. Accordingly, the thickness of the first layer may be set to fall within a range of less than one atomic layer to several atomic layers. In addition, when the thickness of the first layer is set to be one atomic layer or less (i.e., one atomic layer or less than one atomic layer), the effect of the modification reaction at Step 2, which will be described later, can be relatively increased, which can lead to shortening a time required for the modification reaction at Step 2. It is also possible to shorten a time required for forming the first layer at Step 1. As a result, a processing time per cycle can be shortened, and hence, a total processing time can also be shortened. As such, the film forming rate can be increased. In addition, if the thickness of the first layer is set to be one atomic layer or less, it is possible to better control film thickness uniformity (Residual Gas Removal)

After the first layer is formed, the valves **243*a*, 243*d*, and 243*e* are closed to stop the supply of the BTCSM gas and the $N_2$ gas. In this operation, while the exhaust system is opened, the BTCSM gas remaining in the process chamber 201 is exhausted through the exhaust system. FIG. 4 illustrates an example where the APC valve 244 is fully opened when the exhaust system is opened and the interior of the process chamber 201 is vacuum-exhausted to remove from the interior of the process chamber 201 the BTCSM gas, which has not reacted or remains after contributing to the formation of the first layer, remaining in the process chamber 201. When the exhaust system is opened, the APC valve 244** may not be fully opened and may be slightly closed.

As the precursor gas, in addition to the BTCSM gas, it may be possible to use, for example, a BTCSE gas, a TCDMDS gas, a DCTMDS gas, or an MCPMDS gas. As the inert gas, in addition to the $N_2$ gas, it may be possible to use a rare gas such as an Ar gas, a He gas, a Ne gas, a Xe gas, or the like.

[Step 2]

($NH_3$ Gas Supply)

After Step 1 is completed, an $NH_3$ gas is supplied to the wafers 200 in the process chamber 201 while the exhaust system is sealed, to confine the $NH_3$ gas in the process chamber 201.

When the exhaust system is sealed, the APC valve 244 is fully closed. When the $NH_3$ gas is supplied to the wafers 200 in the process chamber 201, opening and closing controls of the valves **243*b*, 243*d*, and 243*e* are performed in the same manner as the opening and closing controls of the valves 243*b*, 243*d*, and 243*e* that are performed at Step 1. A supply flow rate of the $NH_3$ gas controlled by the MFC 241*b* is set to fall within a range, for example, of 10 to 10,000 sccm. A supply flow rate of the $N_2$ gas controlled by the MFCs 241*d* or 241*e* is set to fall within a range, for example, of 100 to 10,000 sccm. A time period for supplying the $NH_3$ gas into the process chamber 201**, that is, a gas supply time (i.e., an irradiation time), is set to fall within a range, for example, of 1 to 120 seconds, specifically, 1 to 60 seconds. Other processing conditions may be the same as those of Step 1 as described above.

By supplying the $NH_3$ gas into the process chamber 201 while the exhaust system is sealed, the $NH_3$ gas is confined in the process chamber 201. Thus, the internal pressure of the process chamber 201 begins to increase. By continuously supplying the $NH_3$ gas into the process chamber 201 while the exhaust system is sealed, the internal pressure of the process chamber 201 continues to increase. By continuously supplying the $NH_3$ gas while the exhaust system is sealed, an ultimately-reached internal pressure of the process chamber 201, that is, a target internal pressure of the process chamber 201, is set to be higher than the target internal pressure of the process chamber 201 available when supplying the BTCSM gas at Step 1. Specifically, the target internal pressure (i.e., total internal pressure) of the process chamber 201 is set to fall within a range, for example, of 400 to 5,000 Pa, specifically, 500 to 4,000 Pa. In this operation, a partial pressure of the $NH_3$ gas in the process chamber 201 falls within a range, for example, of 360 to 4,950 Pa. By setting the internal pressure of the process chamber 201 and the partial pressure of the $NH_3$ gas in the process chamber 201 to fall within the above high pressure zones, the $NH_3$ gas supplied into the process chamber 201 can be activated efficiently by using heat under a non-plasma condition, even if the internal temperature of the process chamber 201, ultimately, the temperature of the wafers 200, is set to fall within a relatively low temperature range, for example, of 400 to 500 degrees C., at Step 2.

By supplying the thermally-activated $NH_3$ gas to the wafers 200 under the above-described conditions, at least a portion of the first layer formed on the wafer 200 is nitrided (i.e., modified). As a result of the modification of the first layer, a second layer containing Si, C, and N, that is, a SiCN layer, is formed on the wafers 200. The supply of the thermally activated $NH_3$ gas under a non-plasma condition can have the above reaction to occur softly, which in turn can facilitate the formation of the SiCN layer. When the second layer is formed, impurities such as Cl and the like included in the first layer generate a gaseous substance containing at least Cl in the course of the modification reaction of the first layer by the $NH_3$ gas, and the gaseous substance is exhausted from the interior of the process chamber 201. As such, the impurities such as Cl and the like included in the first layer are separated from the first layer by being extracted or desorbed from the first layer. Thus, the second layer becomes a layer having fewer impurities such as Cl and the like than the first layer.

(Residual Gas Removal)

After the second layer is formed, the valves **243*a*, 243*d*, and 243*e* are closed to stop the supply of the $NH_3$ gas and the $N_2$ gas. In this operation, while the exhaust system is opened, the $NH_3$ gas remaining in the process chamber 201 is exhausted through the exhaust system. FIG. 4 illustrates an example, which is similar to that of Step 1, where the APC valve 244 is fully opened when the exhaust system is opened and the interior of the process chamber 201 is vacuum-exhausted to remove from the interior of the process chamber 201 the $NH_3$ gas, which has not reacted or remains after contribution to the formation of the second layer, or reaction byproduct, remaining in the process chamber 201. Similar to Step 1, when the exhaust system is opened, the APC valve 244** may not be fully opened and may be slightly closed.

As the nitrogen-containing gas (i.e., nitriding gas) used as the reaction gas, in addition to the $NH_3$ gas, it may be possible to use, for example, a hydrogen nitride-based gas such as a diazene ($N_2H_2$) gas, a hydrazine ($N_2H_4$) gas, an $N_3H_8$ gas, or the like, or a gas containing the above compounds. As the inert gas, in addition to the $N_2$ gas, it may be possible to use a rare gas such as an Ar gas, a He gas, a Ne gas, a Xe gas, or the like.

(Performing Cycle Predetermined Number of Times)

A cycle that non-simultaneously performs Steps 1 and 2 as described above is performed one or more times (e.g., a predetermined number of times) to form a SiCN film having a predetermined composition and a predetermined thickness on the wafer 200. The above cycle may be repeated multiple times. As such, a thickness of the SiCN layer formed per one cycle is set to be smaller than a desired film thickness and the above cycle may be repeated multiple times until the desired film thickness is obtained.

In the configuration in which the cycle is performed multiple times, the phrase "a predetermined gas is supplied to the wafer 200" at each step in at least a second cycle or subsequent cycles may mean that "a predetermined gas is supplied to a layer formed on the wafer 200, that is, on the uppermost surface of the wafer 200 as a laminated body." The phrase "a predetermined layer is formed on the wafer 200" may mean that "a predetermined layer is formed on a layer formed on the wafer 200, that is, on the uppermost surface of the wafer 200 as a laminated body." The above definitions are the same as those described above. The definitions also apply to each of modifications and other embodiments, which will be described later.

(Purge and Return to Atmospheric Pressure)

The valves **243*d* and 243*e* are opened. The $N_2$ gas is supplied into the process chamber 201 from each of the gas supply pipes 232*d* and 232*e*, and is exhausted through the exhaust pipe 231. The $N_2$ gas serves as a purge gas. Thus, the interior of the process chamber 201 is purged, and residual gas or reaction byproduct remaining in the process chamber 201 is removed from the interior of the process chamber 201 (i.e., purge). Thereafter, the internal atmosphere of the process chamber 201 is substituted with an inert gas (i.e., inert gas substitution), and the internal pressure of the process chamber 201** is returned to atmospheric pressure (i.e., return to atmospheric pressure).

(Boat Unload and Wafer Discharge)

The seal cap 219 is moved down by the boat elevator 115 to open the lower end portion of the reaction tube 203. The processed wafers 200 supported by the boat 217 is unloaded from the lower end portion of the reaction tube 203 outside of the reaction tube 203 (i.e., boat unload). The processed wafers 200 are then discharged from the boat 217 (i.e., wafer discharge).

(3) Effects According to the Present Embodiment

According to the present embodiment, one or more effects may be achieved, as follows.

(a) While the exhaust system is sealed, the $NH_3$ gas is supplied to the wafers 200 in the process chamber 201 and confined in the process chamber 201, which can prevent the $NH_3$ gas from being discharged from the interior of the process chamber 201 before the $NH_3$ gas is thermally activated. Furthermore, it is possible to sufficiently secure a time period for which the $NH_3$ gas stays in the process chamber 201, ultimately, a heating time required for thermally activating the $NH_3$ gas. Thus, activation of the $NH_3$ gas is reliably performed. Accordingly, it is possible to promote a reaction of the first layer with the $NH_3$ gas. As a result, a film forming rate of the second layer, that is, a film forming rate of the SiCN film can be increased. According to the present embodiment, although the SiCN film is formed in a relatively low temperature zone, for example, of 400 to 500 degrees C., it is easy to have the first layer to react with the $NH_3$ gas. Thus, the SiCN film can be formed at a practical film forming rate. It is also possible to reduce an amount of the $NH_3$ gas discharged from the interior of the process chamber 201 without contributing to the reaction with the first layer, which can increase use efficiency of the $NH_3$ gas and reduce a film forming cost.

(b) The opening degree of the APC valve 244 when the $NH_3$ gas is confined is set to be smaller than the opening degree of the APC valve 244 when the BTCSM gas is supplied, such that the target internal pressure of the process chamber 201 when the $NH_3$ gas is confined can be set to be higher than the target internal pressure of the process chamber 201 when the BTCSM gas is supplied. This configuration can efficiently activate the $NH_3$ gas confined in the process chamber 201 and further increase the film forming rate of the SiCN film.

In particular, when the $NH_3$ gas is confined, the APC valve 244 is fully closed to seal the exhaust system, which can further increase the target internal pressure of the process chamber 201 when the $NH_3$ gas is confined. Since the exhaust system is sealed when the $NH_3$ gas is confined, the internal pressure of the process chamber 201 can be increased at a high speed and within a short period of time. This configuration can effectively activate the $NH_3$ gas confined in the process chamber 201 and further increase the film forming rate of the SiCN film.

(c) When the $NH_3$ gas is confined, the internal pressure of the process chamber 201 can be continuously increased by continuously supplying the $NH_3$ gas into the process chamber 201. This makes it possible to further increase the target internal pressure of the process chamber 201 when the $NH_3$ gas is confined. As a result, he $NH_3$ gas supplied into the process chamber 201 can be effectively activated, and the film forming rate of the SiCN film can be increased.

By continuously supplying the $NH_3$ gas into the process chamber 201 when the $NH_3$ gas is confined, it is possible to supplement the $NH_3$ gas consumed by the reaction with the first layer, that is, to keep the partial pressure of the $NH_3$ gas in the process chamber 201 high. This makes it possible to maintain efficiency of a reaction between the first layer and the $NH_3$ gas. As such, reduction in the film forming rate of the SiCN film can be suppressed.

(d) By supplying the activated $NH_3$ gas, impurities such as Cl and the like can be efficiently extracted or desorbed from the first layer. Thus, the second layer becomes a layer having a low amount of impurities. As a result, even if a film is formed in a relatively low temperature zone, for example, of 400 to 500 degrees C., concentration of impurities in the SiCN film can be reduced. Consequently, the SiCN film becomes a film having a high resistance to hydrogen fluoride (HF).

(e) The $NH_3$ gas is activated under a non-plasma atmosphere or a non-plasma condition, by using heat. Thus, when the first layer reacts with the $NH_3$ gas, at least a portion of the Si—C bonds in the first layer can be maintained to be unbroken as they are. This can suppress desorption of C from the first layer, that is, reduction of C concentration in the second layer. As a result, it is possible to suppress reduction of in-film C concentration in the SiCN film. Consequently, the SiCN film becomes a film having a high HF resistance.

(f) By performing the above cycle a predetermined number of times under a non-plasma condition, plasma damage to the wafer 200 or the SiCN film formed on the wafer 200 can be avoided. For example, it is possible to avoid a situation that a gate insulation film or the like formed on the wafer 200 is destroyed due to physical damage such as collision of charged particles or the like, or a situation that a device structure formed on the wafer 200 is electrically charged and destroyed due to charging damage. Likewise, it is also possible to avoid plasma damage to the members disposed in the process chamber 201, which can reduce maintenance cost of the substrate processing apparatus.

(g) By using a halosilane precursor gas such as a BTCSM gas or the like containing a plurality of halogen elements (Cl) in one molecule, the first layer can be efficiently formed and the film forming rate of the SiCN film can be increased. Furthermore, the consumption of the BTCSM gas that does not contribute to the film formation can be reduced, which can lead to reduction in the cost of film forming.

(h) By using the alkylene halosilane precursor gas such as a BTCSM gas or the like which is small in a molecular weight (i.e., molecular size) of an alkylene group contained in one molecule, it is possible to further increase the film forming rate and to form a strong film for the following reasons. For example, in the case of using an alkylene halosilane precursor gas which contains, in one molecule, an alkylene group such as a hexylene group or a heptylene group having a large molecular weight, the alkylene group having a large molecular weight may sometimes cause steric hindrance that inhibits a reaction of Si contained in the precursor gas, thereby inhibiting formation of the first layer. Moreover, if the above alkylene group remains in the first layer in a non-decomposed state or an only partially decomposed state, the alkylene group having a large molecular weight may sometimes cause steric hindrance that inhibits the reaction of Si contained in the first layer with the $NH_3$ gas, thereby inhibiting formation of the second layer. In contrast, by using an alkylene halosilane precursor gas such as a BTCSM gas or the like which is small in molecular weight of alkylene groups contained in one molecule, it is possible to suppress generation of the steric hindrance and to promote formation of the first layer and the second layer. Consequently, it is possible to increase a film forming rate and to form a strong film. The same effect can be obtained in the case of using an alkyl halosilane precursor gas such as a TCDMDS gas or the like which is small in molecular weight of alkyl groups contained in one molecule.

(i) By using a precursor gas such as a BTCSM gas or the like containing two Si atoms in one molecule, the finally-formed SiCN film becomes a film in which Si atoms adjoin one another for the following reasons. When the first layer is formed under a condition in which the BTCSM gas is not autolyzed, two Si atoms contained in a BTCSM gas molecule are adsorbed onto the wafer 200 (i.e., a base film of a surface of the wafer 200) in a mutually adjoining state. Furthermore, when the first layer is formed under a condition in which the BTCSM gas is autolyzed, two Si atoms contained in a BTCSM gas molecule have a strong tendency to be deposited on the wafer 200 in a mutually adjoining state. As such, by using a gas such as a BTCSM gas or the like containing two Si atoms in one molecule, as compared with the case where a gas such as a dichlorosilane ($SiH_2Cl_2$, abbreviation: DCS) gas or the like containing only one Si atom in one molecule is used, it is possible to make sure that Si atoms contained in the first layer is in a mutually-adjoining state. Consequently, the SiCN film becomes a film in which Si atoms adjoin one another. This makes it possible to enhance a HF resistance of the film.

(j) By using the alkylene halosilane precursor gas such as a BTCSM gas or the like acting as a Si source and a C source, and the reaction gas such as an $NH_3$ gas or the like acting as a N source, that is, by using two kinds of gases, it is possible to form a film containing three elements, Si, C, and N. In other words, when a film is formed, there is no need to independently supply three kinds of gases, specifically, a Si source, a C source, and a N source. Accordingly, as compared with the case where three kinds of gases are used, it is possible to reduce the number of gas supply steps by one step, which can shorten a time required for one cycle and improve productivity of a film forming process. Moreover, as compared with the case where three kinds of gases are used, the number of gas supply lines can be reduced by one line, which can simplify a structure of a substrate processing apparatus and reduce manufacturing cost or maintenance cost of the substrate processing apparatus.

(k) Since the BTCSM gas is low in degradability (or low in reactivity), and its pyrolysis temperature is high, even if a film is formed in a relatively high temperature zone, for example, of 650 to 800 degrees C., an excessive gas phase reaction can be suppressed. As a result, generation of particles in the process chamber 201 can be suppressed and substrate processing quality can be improved.

(l) By non-simultaneously or alternately performing supply steps of different gases, the gases are allowed to appropriately react under a condition in which a surface reaction is dominant. Consequently, step coverage of the SiCN film can be improved and thickness of the film can be controlled. In addition, generation of an excessive gas phase reaction in the process chamber 201 can be avoided and generation of particles can be suppressed.

(m) The above effects may also be achieved in the case where a precursor gas other than the BTCSM gas, which has an Si—C bond, is used as the precursor gas, the case where a nitrogen-containing gas other than the $NH_3$ gas is used as the reaction gas, or the case where a gas other than the nitrogen-containing gas, for example, a gas containing N and C, an oxygen-containing gas, a boron-containing gas, or a carbon-containing gas, is used as the reaction gas.

(4) Modifications

The film forming sequence according to the present embodiment is not limited to the sequence illustrated in FIG. 4 and may be modified, as will be described below.

(Modification 1)

Figure 5:
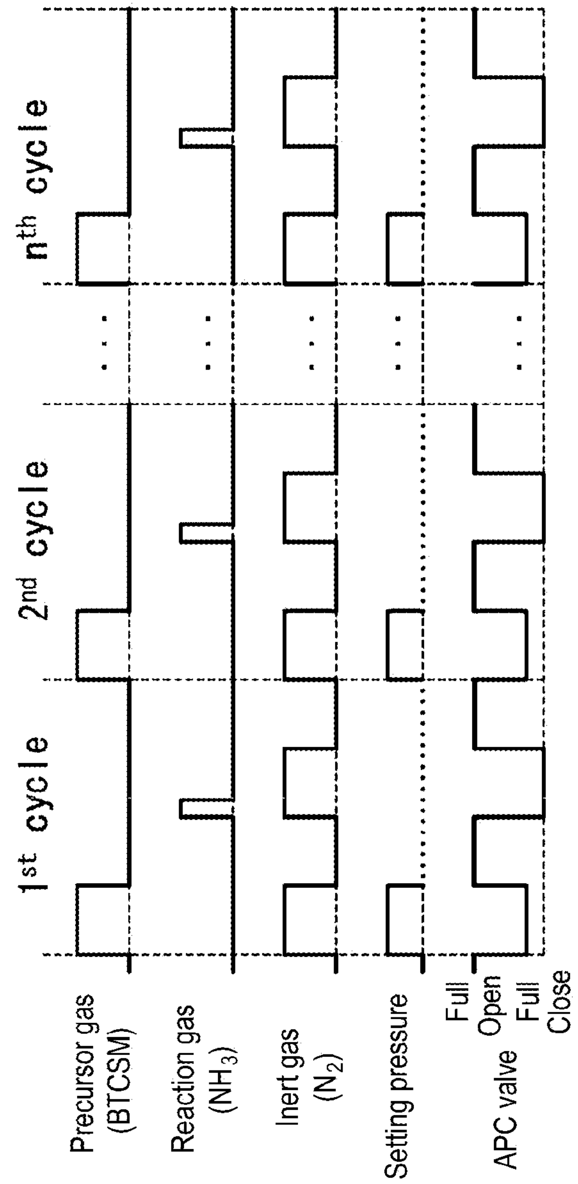
FIG. 5 illustrates Modification 1 of gas supply timings in a film forming sequence according to one embodiment of the present disclosure.

As illustrated in FIG. 5, in the step of supplying the $NH_3$ gas, the supply of the $NH_3$ gas may be stopped before the supply of the $N_2$ gas is stopped. Thus, in the step of supplying the $NH_3$ gas, after the supply of the $NH_3$ gas into the process chamber 201 is stopped an internal pressure (i.e., total pressure) of the process chamber 201 filled with the $NH_3$ gas may be continuously increased by continuously supplying the $N_2$ gas into the process chamber 201 while the exhaust system is sealed.

A time for supplying the $NH_3$ gas into the process chamber 201 may be set to fall within a range, for example, of 1 to 60 seconds, specifically, 1 to 30 seconds. A time for continuously supplying the $N_2$ gas into the process chamber 201 after the supply of the $NH_3$ gas is stopped may be set to fall within a range, for example, of 1 to 60 seconds, specifically, 1 to 30 seconds. Other processing procedures and processing conditions may be the same as those of the film forming sequence illustrated in FIG. 4. Moreover, in this modification, processing procedures and processing conditions at the step of supplying the BTCSM gas may be the same as those of the film forming sequence illustrated in FIG. 4.

In this modification, the same effects as those of the film forming sequence illustrated in FIG. 4 may be achieved.

According to this modification, it is possible to improve uniformity of a film thickness and a film quality of the SiCN film between the planes of the wafers 200 and within the plane of each of the wafers 200, for the following reasons. The $N_2$ gas supplied into the process chamber 201 after the supply of the $NH_3$ gas is stopped acts not only as a pressure-increasing gas that increases the internal pressure of the process chamber 201 but also as a stirring gas (or a piston) that stirs (or diffuses) the $NH_3$ gas in the process chamber 201. By the above actions of the $N_2$ gas, the $NH_3$ gas confined in the process chamber 201 is uniformly spread within the process chamber 201 after the supply of the $NH_3$ gas is stopped. As a result, it is possible to improve the uniformity of the film thickness and the film quality of the SiCN film between the planes of the wafers 200 and within the plane of each of the wafers 200.

According to this modification, a used amount of the $NH_3$ gas and a film forming cost can be reduced.

(Modification 2)

Figure 6:
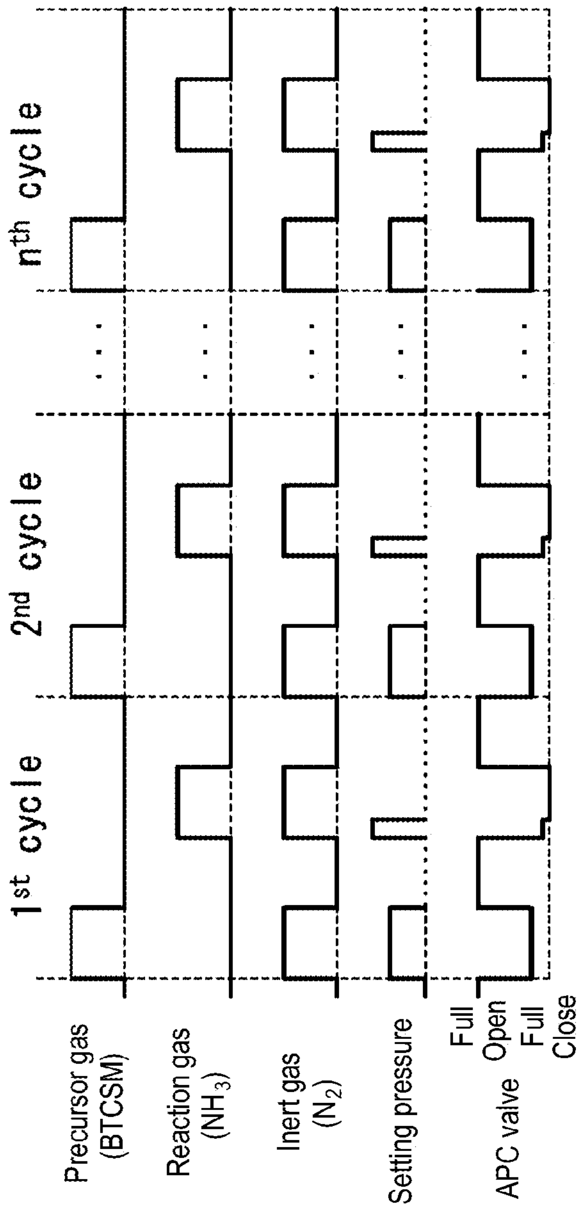
FIG. 6 illustrates Modification 2 of gas supply timings in a film forming sequence according to one embodiment of the present disclosure.

As illustrated in FIG. 6, in the step of supplying the $NH_3$ gas, the $NH_3$ gas may be allowed to preliminarily flow through the process chamber 201 while the exhaust system is opened, and the $NH_3$ gas may then be supplied into and confined in the process chamber 201 while the exhaust system is sealed. When the $NH_3$ gas is preliminarily flowed, the valves 243*b*, 243*d*, and 243*e* are opened while the APC valve 244 is opened. The opening degree of the APC valve 244 may be smaller than the opening degree of the APC valve 244 at the step of supplying the BTCSM gas. For example, the APC valve 244 is slightly opened such that a gas flow moving from the interior of the process chamber 201 toward the exhaust system is slightly formed. By controlling the opening degree of the APC valve 244 in the above manner, it is possible to sufficiently increase the internal pressure of the process chamber 201 when the $NH_3$ gas preliminarily flows through the process chamber 201, which can efficiently activate the $NH_3$ gas supplied into the process chamber 201. Thereafter, the APC valve 244 is fully closed to cut off the gas flow moving from the interior of the process chamber 201 toward the exhaust system, so as to confine the $NH_3$ gas in the process chamber 201. Processing procedures and processing conditions at the step of supplying the BTCSM gas in this modification may be the same as those of the film forming sequence illustrated in FIG. 4.

In this modification, the same effects as those of the film forming sequence illustrated in FIG. 4 may be achieved.

According to this modification, a film quality of the SiCN film can be improved, for the following reasons. When the confinement of the $NH_3$ gas in the process chamber 201 is started, there may be a case where a small amount of the BTCSM gas remains in the process chamber 201, for example, on surfaces of members disposed in the process chamber 201. In this case, if the confinement of the $NH_3$ gas in the process chamber 201 is started, the BTCSM gas and the $NH_3$ gas react with each other. Thus, a reaction byproduct such as ammonium chloride ($NH_4Cl$) or the like may be generated in the process chamber 201. Particles including the reaction byproduct may sometimes be generated in the process chamber 201. If such particles are confined in the process chamber 201 together with the $NH_3$ gas, the particles may be introduced into the SiCN film, eventually deteriorating the film quality of the SiCN film. In this modification, before the confinement of the $NH_3$ gas into the process chamber 201 is started, the $NH_3$ gas is first allowed to preliminarily flow through the process chamber 201 while the exhaust system is opened, which can facilitate removal of the reaction byproduct and the particles from the interior of the process chamber 201. As a result, the film quality of the SiCN film can be improved.

(Modification 3)

Instead of the step of supplying the $NH_3$ gas, a step of supplying a gas containing N and C, such as a TEA gas or the like, may be performed. Specifically, a cycle that non-simultaneously performs a step of supplying a BTCSM gas and a step of supplying a gas containing N and C such as a TEA gas or the like may be performed a predetermined number of times (e.g., n times).

At the step of supplying the TEA gas, the TEA gas is supplied to the wafer 200 in the process chamber 201 while the exhaust system is sealed, such that the TEA gas is confined in the process chamber 201. As such, the TEA gas is allowed to flow from the gas supply pipe 232*b*. Opening and closing controls of the APC valve 244 and the valves 243*b*, 243*d*, and 243*e* are executed in the same manner as those of the APC valve 244 and the valves 243*b*, 243*d*, and 243*e* at Step 2 of the film forming sequence illustrated in FIG. 4. A supply flow rate of the TEA gas controlled by the MFC 241*b* is set to fall within a range, for example, of 100 to 10,000 sccm. A time for supplying the TEA gas into the process chamber 201, that is, a gas supply time (i.e., irradiation time), is set to fall within a range, for example, of 1 to 200 seconds, specifically, 1 to 120 seconds, more specifically, 1 to 60 seconds. Other processing conditions may be the same, for example, as those of Step 2 of the film forming sequence illustrated in FIG. 4. Moreover, processing procedures and processing conditions at the step of supplying the BTCSM gas in this modification may be the same as those of the film forming sequence illustrated in FIG. 4.

By supplying the TEA gas into the process chamber 201 while the exhaust system is sealed, an internal pressure of the process chamber 201 is allowed to reach a pressure which falls within a range, for example, of 400 to 5,000 Pa, specifically, 500 to 4,000 Pa. In this operation, a partial pressure of the TEA gas in the process chamber 201 reaches a pressure which falls within a range, for example, of 360 to 4,950 Pa. By setting the internal pressure of the process chamber 201 and the partial pressure of the TEA gas in the process chamber 201 to fall within the above high pressure zones, the TEA gas supplied into the process chamber 201 can be efficiently activated by using heat, under a non-plasma condition, although an internal temperature of the process chamber 201 is set to fall within a relatively low temperature zone, for example, of 400 to 500 degrees C.

By supplying the thermally-activated TEA gas to the wafer 200 under the above conditions, the first layer (i.e., the Si-containing layer containing C and Cl) formed on the wafer 200 can react with the TEA gas to modify the first layer. In this operation, a N component and a C component contained in the TEA gas are added to the first layer, such that a layer containing C and N, that is, a SiCN layer, is formed on the wafer 200. As a result of introduction of the C component in the TEA gas, the layer formed as above becomes a layer having a larger amount of a C component (i.e., a C-rich layer) than the second layer formed by the film forming sequence illustrated in FIG. 4. The supply of the thermally activated TEA gas under a non-plasma condition can have the above reaction to occur softly, which in turn can facilitate formation of the SiCN layer. When the SiCN layer is formed, impurities such as Cl and the like included in the first layer generate a gaseous substance containing at least Cl in the course of the modification reaction of the first layer by the TEA gas, and the gaseous substance is exhausted from the interior of the process chamber 201. As such, the impurities such as Cl and the like included in the first layer are separated from the first layer by being extracted or desorbed from the first layer. Thus, the SiCN layer becomes a layer having fewer impurities such as Cl and the like than the first layer.

After the SiCN layer is formed, the valve **243*b* is closed to stop the supply of the TEA gas. By the same processing procedures as those of Step 2 of the film forming sequence illustrated in FIG. 4, the TEA gas, which has not reacted or remains after contributing to the formation of the SiCN layer, or reaction byproduct, remaining in the process chamber 201, is removed from the interior of the process chamber 201**.

As the N- and C-containing gas, in addition to the TEA gas, it may be possible to use, for example, an ethylamine-based gas such as a diethylamine ($(C_2H_5)_2NH$, abbreviation: DEA) gas, a monoethylamine ($C_2H_5NH_2$, abbreviation: MEA) gas or the like, a methylamine-based gas such as a trimethylamine ($(CH_3)_3N$, abbreviation: TMA) gas, a dimethylamine ($(CH_3)_2NH$, abbreviation: DMA) gas, a monomethylamine ($CH_3NH_2$, abbreviation: MMA) gas or the like, a propylamine-based gas such as a tripropylamine ($(C_3H_7)_3N$, abbreviation: TPA) gas, a dipropylamine ($(C_3H_7)_2NH$, abbreviation: DPA) gas, a monopropylamine ($C_3H_7NH_2$, abbreviation: MPA) gas or the like, an isopropylamine-based gas such as a triisopropylamine ($[(CH_3)_2CH]_3N$, abbreviation: TIPA) gas, a diisopropylamine ($[(CH_3)_2CH]_2NH$, abbreviation: DIPA) gas, a monoisopropylamine ($(CH_3)_2CHNH_2$, abbreviation: MIPA) gas or the like, a butylamine-based gas such as a tributylamine ($(C_4H_9)_3N$, abbreviation: TBA) gas, a dibutylamine ($(C_4H_9)_2NH$, abbreviation: DBA) gas, a monobutylamine ($C_4H_9NH_2$, abbreviation: MBA) gas or the like, and an isobutylamine-based gas such as a triisobutylamine ($[(CH_3)_2CHCH_2]_3N$, abbreviation: TIBA) gas, a diisobutylamine ($[(CH_3)_2CHCH_2]_2NH$, abbreviation: DIBA) gas, a monoisobutylamine ($(CH_3)_2CHCH_2NH_2$, abbreviation: MIBA) gas or the like. As such, at least one of the gases denoted as composition formulae, $(C_2H_5)_xNH_{3-x}$, $(CH_3)NH_{3-x}$, $(C_3H_7)_xNH_{3-x}$, $[(CH_3)_2CH]_xNH_{3-x}$, $(C_4H_9)_xNH_{3-x}$ and $[(CH_3)_2CHCH_2]_xNH_{3-x}$ (where x is an integer of 1 to 3) may be used as the amine-based gas. In order to increase C concentration while an increase of N concentration in the SiCN film is suppressed, a gas having a molecule in which the number of C atoms is larger than the number of N atoms may be used as the amine-based gas. Specifically, a gas which contains at least one amine selected from a group consisting of TEA, DEA, MEA, TMA, DMA, TPA, DPA, MPA, TIPA, DIPA, MIPA, TBA, DBA, MBA, TIBA, DIBA, and MIBA may be used as the amine-based gas.

As the N- and C-containing gas, in addition to the amine-based gas, it may be possible to use, for example, an organic hydrazine-based gas. Herein, the organic hydrazine-based gas refers to gaseous organic hydrazine (or compound), for example, a gas which is obtained by vaporizing organic hydrazine in a liquid state under room temperature and atmospheric pressure or a gas which contains a hydrazine group, such as organic hydrazine or the like, in a gaseous state under room temperature and atmospheric pressure. The organic hydrazine-based gas may be simply referred to as an organic hydrazine gas or an organic hydrazine compound gas. The organic hydrazine-based gas is a Si-free gas composed of three elements, C, N, and H, and is a gas which does not contain Si and metal. As the organic hydrazine-based gas, it may be possible to use, for example, a methylhydrazine-based gas such as a monomethylhydrazine ($(CH_3)HN_2H_2$, abbreviation: MMH) gas, a dimethylhydrazine ($(CH_3)_2N_2H_2$, abbreviation: DMH) gas, a trimethylhydrazine ($(CH_3)_2N_2(CH_3)H$, abbreviation; TMH) gas or the like, and an ethylhydrazine-based gas such as an ethylhydrazine ($(C_2H_5)HN_2H_2$, abbreviation: EH) gas or the like. In order to increase the C concentration while an increase of the N concentration in the SiCN film is suppressed, a gas having a molecule in which the number of C atoms is larger than the number of N atoms may be used as the organic hydrazine-based gas.

As the amine-based gas or the organic hydrazine-based gas, it may be possible to use a gas having a plurality of C-containing ligands in one molecule, that is, a gas having a plurality of hydrocarbon groups such as alkyl groups or the like in one molecule. More specifically, as the amine-based gas or the organic hydrazine-based gas, it may be possible to use a gas having three or two C-containing ligands (e.g., hydrocarbon groups such as alkyl groups or the like), i.e., organic ligands, in one molecule.

By performing one or more times (e.g., a predetermined number of times) a cycle that non-simultaneously performs the above respective steps, it is possible to form a SiCN film having a predetermined composition and a predetermined thickness on the wafer 200. As described above with respect to the film forming sequence illustrated in FIG. 4, a thickness of the SiCN layer formed per one cycle may be set to be smaller than a desired film thickness, and the above cycle may be repeated multiple times until the desired film thickness is obtained.

According to this modification, the same effects as those of the film forming sequence illustrated in FIG. 4 may be achieved. In addition, by performing the step of supplying the TEA gas which acts as a C source, in other words, by performing film formation by using two kinds of carbon sources (i.e., double carbon sources) in one cycle, the SiCN film formed on the wafer 200 becomes a film having a larger amount of a C component (i.e., C-rich film) than the SiCN film that is formed in the film forming sequence illustrated in FIG. 4. As such, a window for controlling a composition ratio of the SiCN film may be expanded.

(Modification 4)

Figure 7:
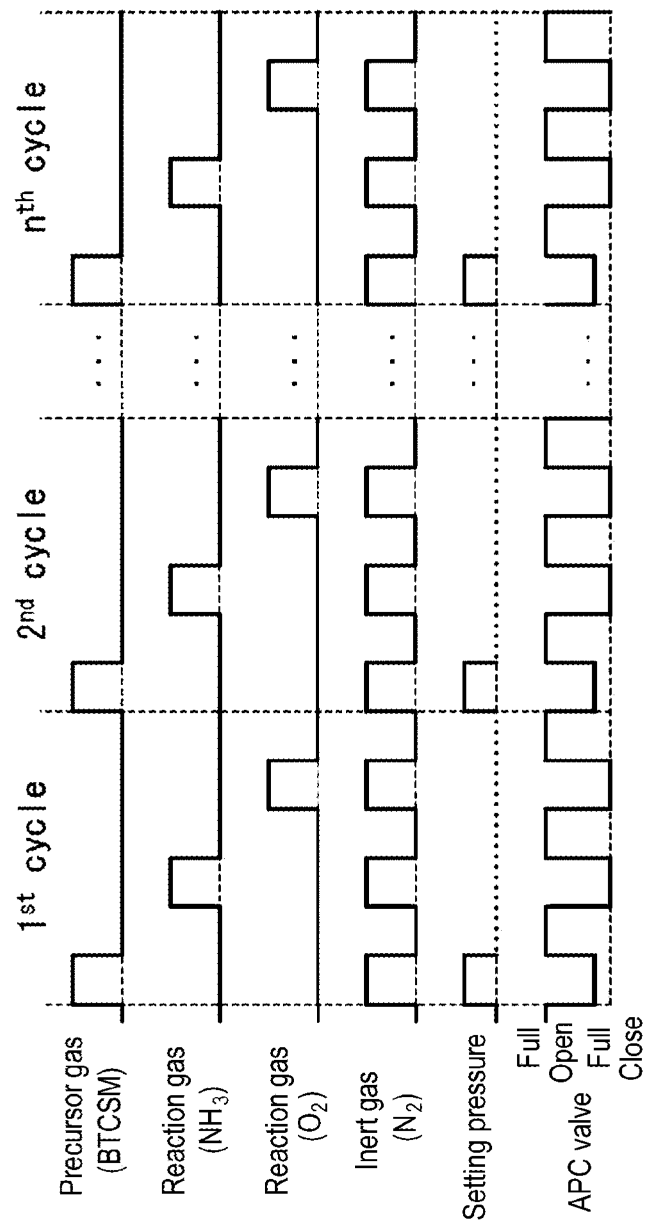
FIG. 7 illustrates Modification 4 of gas supply timings in a film forming sequence according to one embodiment of the present disclosure.

As illustrated in FIG. 7, a step of supplying an oxygen-containing gas such as an $O_2$ gas or the like may be additionally performed. Specifically, a cycle that non-simultaneously performs a step of supplying a BTCSM gas, a step of supplying a $NH_3$ gas, and a step of supplying an oxygen-containing gas such as an $O_2$ gas or the like may be performed a predetermined number of times (e.g., n times). Processing procedures and processing conditions at the step of supplying the BTCSM gas and the step of supplying the $NH_3$ gas in this modification may be the same as those of the film forming sequence illustrated in FIG. 4.

At the step of supplying the $O_2$ gas, the $O_2$ gas is supplied to the wafers 200 in the process chamber 201 while the exhaust system is sealed, such that the $O_2$ gas is confined in the process chamber 201. In this operation, the $O_2$ gas is allowed to flow from the gas supply pipe 232*b*. Opening and closing controls of the APC valve 244 and the valves 243*b*, 243*d*, and 243*e* are executed in the same manner as those of the APC valve 244 and the valves 243*b*, 243*d*, and 243*e* at Step 2 of the film forming sequence illustrated in FIG. 4. A supply flow rate of the $O_2$ gas controlled by the MFC 241*b* is set to fall within a range, for example, of 100 to 10,000 sccm. A time for supplying the $O_2$ gas into the process chamber 201, that is, a gas supply time (i.e., irradiation time), is set to fall within a range, for example, of 1 to 120 seconds, specifically, 1 to 60 seconds. Other processing conditions may be the same, for example, as those of step 2 of the film forming sequence illustrated in FIG. 4.

By supplying the $O_2$ gas into the process chamber 201 while the exhaust system is sealed, an internal pressure of the process chamber 201 is allowed to reach a pressure which falls within a range, for example, of 400 to 5,000 Pa, specifically, 500 to 4,000 Pa. In this operation, a partial pressure of the $O_2$ gas in the process chamber 201 becomes a pressure which falls within a range, for example, of 360 to 4,950 Pa. By setting the internal pressure of the process chamber 201 and the partial pressure of the $O_2$ gas in the process chamber 201 to fall within the above high pressure zones, the $O_2$ gas supplied into the process chamber 201 may be efficiently activated by using heat, under a non-plasma condition, and oxidizing power of the $O_2$ gas may be increased, although an internal temperature of the process chamber 201 is set to fall within a relatively low temperature zone, for example, of 400 to 500 degrees C.

By supplying the thermally-activated $O_2$ gas to the wafers 200 under the above conditions, at least a portion of the second layer (i.e., SiCN layer) formed on the wafer 200 is oxidized (i.e., modified). As a result of the modification of the SiCN layer, a layer containing O, C, and N, that is, a silicon oxycarbonitride layer (SiOCN layer), is formed on the wafer 200. When the SiOCN layer is formed, impurities such as Cl and the like included in the SiCN layer generate a gaseous substance containing at least Cl in the course of the modification reaction of the SiCN layer by the $O_2$ gas, and the gaseous substance is exhausted from the interior of the process chamber 201. As such, the impurities such as Cl and the like included in the SiCN layer are separated from the SiCN layer by being extracted or desorbed from the SiCN layer. Thus, the SiOCN layer becomes a layer having fewer impurities such as Cl and the like than the SiCN layer. The supply of the thermally activated $O_2$ gas under a non-plasma condition can have the above reaction to occur softly, which facilitates the formation the SiOCN layer.

After the SiOCN layer is formed, the valve 243*b* is closed to stop the supply of the $O_2$ gas. By the same processing procedures as those of Step 2 of the film forming sequence illustrated in FIG. 4, the $O_2$ gas, which has not reacted or remained after contributing to the formation of the SiOCN layer, or reaction byproduct, remaining in the process chamber 201, is removed from the interior of the process chamber 201.

As the oxygen-containing gas, in addition to the $O_2$ gas, it may be possible to use, for example, a nitrous oxide ($N_2O$) gas, a nitric monoxide (NO) gas, a nitrogen dioxide ($NO_2$) gas, an ozone ($O_3$) gas, a hydrogen ($H_2$)+$O_2$ gas, a $H_2$+$O_3$ gas, a water vapor ($H_2O$), a carbon monoxide (CO) gas, or a carbon dioxide ($CO_2$) gas.

By performing one or more times (e.g., a predetermined number of times) a cycle that non-simultaneously performs the respective steps as described above, it is possible to form a silicon oxycarbonitride film (SiOCN film) having a predetermined composition and a predetermined thickness, as a film containing Si, 0, C, and N, on the wafer 200. As described above with respect to the film forming sequence illustrated in FIG. 4, a thickness of the SiOCN layer formed per one cycle may be set to be smaller than a desired film thickness, and the above cycle may be repeated multiple times until the desired film thickness is obtained.

According to this modification, the same effects as those of the film forming sequence illustrated in FIG. 4 may be achieved. In addition, the supply of the $O_2$ gas makes it possible to further desorb the impurities such as Cl and the like from the SiCN layer. Accordingly, impurity concentration in the SiOCN film can be reduced, and thus, HF resistance of the film can be increased.

(Modification 5)

Instead of the step of supplying the $NH_3$ gas, a step of supplying a TEA gas may be performed. Additionally, a step of supplying an $O_2$ gas may be performed. Specifically, a cycle that non-simultaneously performs a step of supplying a BTCSM gas, a step of supplying a TEA gas, and a step of supplying an $O_2$ gas may be performed a predetermined number of times (e.g., n times). Processing procedures and processing conditions in the respective steps of this modification may be the same as those of the film forming sequence illustrated in FIG. 4 or those of Modifications 3 and 4 as described above.

A SiCN layer is formed on the wafer 200 by performing the step of supplying the BTCSM gas and the step of supplying the TEA gas. Thereafter, at least a portion of the SiCN layer formed on the wafer 200 is oxidized (i.e., modified) by performing the step of supplying the $O_2$ gas. In this operation, if oxidizing power is increased, for example, by increasing a target internal pressure of the process chamber 201, most of N atoms contained in the SiCN layer may be desorbed such that the N atoms are left at an impurity level. Also, the N atoms contained in the SiCN layer may be extinguished substantially. As such, the SiCN layer is modified into a SiOCN layer or a silicon oxycarbide layer (SiOC layer). The supply of the thermally activated $O_2$ gas under a non-plasma condition can have the above reaction to occur softly, which in turn can facilitate the formation the SiOCN layer or the SiOC layer. According to this modification, a SiOCN film or a silicon oxycarbide film (SiOC film) is formed on the wafer 200.

According to this modification, the same effects as those of the film forming sequence illustrated in FIG. 4 and those of modifications 3 and 4 may be achieved. In addition, the supply of the $O_2$ gas makes it possible to further desorb the impurities such as Cl and the like from the SiCN layer. Accordingly, impurity concentration in the SiOCN film or the SiOC film may be reduced, and HF resistance of the film may be increased.

(Modification 6)

Instead of the step of supplying the $NH_3$ gas, it may be possible to perform a step of supplying an $O_2$ gas. Specifically, a cycle that non-simultaneously performs a step of supplying a BTCSM gas and a step of supplying an $O_2$ gas may be performed a predetermined number of times (e.g., n times). Processing procedures and processing conditions at the respective steps in this modification may be the same as those of the film forming sequence illustrated in FIG. 4 or those of Modification 4 as described above.

A first layer (i.e., a Si-containing layer containing C and Cl) is formed on the wafer 200 by performing the step of supplying the BTCSM gas. Thereafter, at least a portion of the first layer formed on the wafer 200 is oxidized (i.e., modified) by performing the step of supplying the $O_2$ gas. As a result of the modification of the first layer, a layer containing Si, O, and C, that is, a silicon oxycarbide layer (SiOC layer), is formed on the wafer 200. According to this modification, a silicon oxycarbide film (SiOC film) having a predetermined composition and a predetermined film thickness, as a film containing Si, O, and C, is formed on the wafer 200.

According to this modification, the same effects as those of the film forming sequence illustrated in FIG. 4 may be achieved. In addition, the supply of the $O_2$ gas makes it possible to desorb the impurities such as Cl and the like from the first layer. Accordingly, impurity concentration in the finally-formed SiOC film may be reduced and HF resistance of the film may be increased.

(Modification 7)

A step of supplying a borane-based gas such as a $BCl_3$ gas or the like may be performed between the step of supplying the BTCSM gas and the step of supplying the $NH_3$ gas. Specifically, a cycle that non-simultaneously performs a step of supplying a BTCSM gas, a step of supplying a borane-based gas such as a $BCl_3$ gas or the like, and a step of supplying a $NH_3$ gas may be performed a predetermined number of times (e.g., n times). Processing procedures and processing conditions at the step of supplying the BTCSM gas and the step of supplying the $NH_3$ gas in this modification may be the same as those of the film forming sequence illustrated in FIG. 4.

At the step of supplying the $BCl_3$ gas, the $BCl_3$ gas is supplied to the wafers 200 in the wafer 200 while the exhaust system is sealed, such that the $BCl_3$ gas is confined in the process chamber 201. In this operation, the $BCl_3$ gas is allowed to flow from the gas supply pipe 232*b*. Opening and closing controls of the APC valve 244 and the valves 243*b*, 243*d*, and 243*e* are executed in the same manner as those of the APC valve 244 and the valves 243*b*, 243*d*, and 243*e* at Step 2 of the film forming sequence illustrated in FIG. 4. A supply flow rate of the $BCl_3$ gas controlled by the MFC 241*b* is set to fall within a range, for example, of 100 to 10,000 sccm. A time for supplying the $BCl_3$ gas into the process chamber 201, that is, a gas supply time (i.e., irradiation time), is set to fall within a range, for example, of 1 to 120 seconds, specifically, 1 to 60 seconds. Other processing conditions may be the same, for example, as the processing conditions of step 2 of the film forming sequence illustrated in FIG. 4.

By supplying the $BCl_3$ gas into the process chamber 201 while the exhaust system is sealed, an internal pressure of the process chamber 201 is allowed to reach a pressure which falls within a range, for example, of 400 to 5,000 Pa, specifically, 500 to 4,000 Pa. In this operation, a partial pressure of the $BCl_3$ gas in the process chamber 201 becomes a pressure which falls within a range, for example, of 360 to 4,950 Pa. By setting the internal pressure of the process chamber 201 and the partial pressure of the $BCl_3$ gas in the process chamber 201 to fall within the above high pressure zones, the $BCl_3$ gas supplied into the process chamber 201 may be efficiently activated by using heat, under a non-plasma condition, even if an internal temperature of the process chamber 201 is set to fall within a relatively low temperature zone of, for example, 400 to 500 degrees C.

By supplying the $BCl_3$ gas to the wafer 200 under the above conditions, a B-containing layer having a thickness of less than one atomic layer, that is, a discontinuous B-containing layer, is formed on the surface of the first layer (i.e., the Si-containing layer containing C and Cl) formed on the wafer 200. The B-containing layer may be a B layer, a chemical adsorption layer of the $BCl_3$ gas, or both of them. As a result of the formation of the B-containing layer on the surface of the first layer, a layer containing Si, B, and C is formed on the wafer 200. Since the $BCl_3$ gas is a non-borazine-based boron-containing gas, the layer containing Si, B, and C becomes a borazine-ring-skeleton-free layer. The supply of the thermally activated $BCl_3$ gas have the above reaction to occur softly under a non-plasma condition, which in turn can facilitate the formation of the layer containing Si, B, and C.

As the borazine-ring-skeleton-free boron-containing gas, in addition to the $BCl_3$ gas, it may be possible to use a halogenated boron-based gas (haloborane-based gas) other than the $BCl_3$ gas, e.g., a chloroborane-based gas other than the $BCl_3$ gas, a fluoroborane-based gas such as a trifluoroborane ($BF_3$) gas or the like, and a bromoborane-based gas such as a tribromoborane ($BBr_3$) gas or the like. Also, a borane-based gas such as a $B_2H_6$ gas or the like may be used. Further, in addition to the inorganic borane-based gas, an organic borane-based gas may be used.

After the layer containing Si, B, and C is formed, the valve 243*b* is closed to stop the supply of the $BCl_3$ gas. By the same processing procedures as those of Step 2 of the film forming sequence illustrated in FIG. 4, the $BCl_3$ gas which has not reacted or remains after contributing to the formation of the layer containing Si, B, and C, or the reaction byproduct, remaining in the process chamber 201, is removed from the interior of the process chamber 201.

Thereafter, the step of supplying the $NH_3$ gas to the wafer 200 is performed. Thus, the layer containing Si, B, and C is modified into a layer containing Si, B, C, and N, that is, a silicon borocarbonitride layer (SiBCN layer).

By performing one or more times (e.g., a predetermined number of times) the cycle that non-simultaneously performs the respective steps as described above, it is possible to form a silicon borocarbonitride film (SiBCN film) having a predetermined composition and a predetermined thickness, as a film containing Si, B, C, and N, on the wafer 200. As described above with respect to the film forming sequence illustrated in FIG. 4, a thickness of the SiBCN layer formed per one cycle may be set to be smaller than a desired film thickness, and the above cycle is repeated multiple times until the desired film thickness is obtained.

According to this modification, the same effects as those of the film forming sequence illustrated in FIG. 4 and those of the respective modifications as described above may be achieved. In addition, addition of B to the film formed on the wafer 200 may increase, for example, HF resistance of the film.

(Modification 8)

A step of supplying a TEA gas may be performed instead of the step of supplying the $NH_3$ gas, and a step of supplying a $BCl_3$ gas may be performed between the step of supplying the BTCSM gas and the step of supplying the TEA gas. Specifically, a cycle that non-simultaneously performs a step of supplying a BTCSM gas, a step of supplying a $BCl_3$ gas, and a step of supplying a TEA gas may be performed a predetermined number of times (e.g., n times). According to this modification, a SiBCN film is formed on the wafer 200. Processing procedures and processing conditions at the respective steps in this modification may be the same as those of the film forming sequence illustrated in FIG. 4 and those of Modifications 3 and 7.

According to this modification, the same effects as those of the film forming sequence illustrated in FIG. 4 and those of Modification 7 may be achieved. In addition, by performing the step of supplying the TEA gas, the SiBCN film formed on the wafer 200 becomes a film having a larger amount of a C component (i.e., C-rich film) than the SiBCN film formed in Modification 7. As such, a window for controlling a composition ratio of the SiBCN film may be expanded.

(Modification 9)

A step of supplying a borazine-based gas such as a TMB gas or the like may be performed instead of the step of supplying the $NH_3$ gas. Specifically, a cycle that non-simultaneously performs a step of supplying a BTCSM gas and a step of supplying a borazine-based gas such as a TMB gas or the like may be performed a predetermined number of times (e.g., n times). Processing procedures and processing conditions at the step of supplying the BTCSM gas in this modification may be the same as those of the film forming sequence illustrated in FIG. 4.

At the step of supplying the TMB gas, the TMB gas is supplied to the wafers 200 in the wafer 200 while the exhaust system is sealed, such that the TMB gas is confined in the process chamber 201. In this operation, the TMB gas is allowed to flow from the gas supply pipe 232*b*. Opening and closing controls of the APC valve 244 and the valves 243*b*, 243*d*, and 243*e* are executed in the same manner as those of the APC valve 244 and the valves 243*b*, 243*d*, and 243*e* at Step 2 of the film forming sequence illustrated in FIG. 4. A supply flow rate of the TMB gas controlled by the MFC 241*b* is set to fall within a range, for example, of 1 to 1,000 sccm. A time for supplying the TMB gas into the process chamber 201, that is, a gas supply time (i.e., irradiation time), is set to fall within a range, for example, of 1 to 120 seconds, specifically, 1 to 60 seconds. Other processing conditions may be the same, for example, as the processing conditions of Step 2 of the film forming sequence illustrated in FIG. 4.

By supplying the TMB gas into the process chamber 201 while the exhaust system is sealed, an internal pressure of the process chamber 201 is allowed to reach a pressure which falls within a range, for example, of 400 to 5,000 Pa, specifically, 500 to 4,000 Pa. In this operation, a partial pressure of the TMB gas in the process chamber 201 becomes a pressure which falls within a range, for example, of 360 to 4,950 Pa. By setting the internal pressure of the process chamber 201 and the partial pressure of the TMB gas in the process chamber 201 to fall within the above high pressure zones, the TMB gas supplied into the process chamber 201 may be efficiently activated by using heat, under a non-plasma condition, even if an internal temperature of the process chamber 201 is set to fall within a relatively low temperature zone, for example, of 400 to 500 degrees C.

As the TMB gas is supplied to the wafer 200 under the above conditions, the first layer (i.e., Si-containing layer containing C and Cl) reacts with the TMB gas. Specifically, Cl (i.e., chloro group) contained in the first layer reacts with a ligand (i.e., methyl group) contained in the TMB. Thus, the Cl of the first layer reacting with the ligand of the TMB may be separated (or extracted) from the first layer. The ligand of the TMB reacting with the Cl of the first layer may be separated from the TMB. Then, N that constitutes a borazine ring of the TMB, from which the ligand is separated, can be bonded to Si of the first layer. Specifically, among B and N constituting the borazine ring of the TMB, the N, which has been caused to have a dangling bond due to the separation of the methyl ligand, may be bonded to the Si contained in the first layer, which has been caused to have a dangling bond, or originally provided with a dangling bond, so as to form a Si—N bond. In this operation, a borazine ring skeleton constituting the borazine ring of the TMB is maintained without being broken.

By supplying the TMB gas under the above conditions, the first layer can properly react with the TMB while the borazine ring skeleton of the TMB is maintained without being broken, which may allow a series of reactions as described above. Most important factors (or conditions) for allowing the series of reactions while the borazine ring skeleton of the TMB is maintained are considered to be a temperature of the wafers 200 and an internal temperature of the process chamber 201, particularly, the temperature of the wafers 200. Appropriately controlling those factors allows appropriate reactions to occur.

Through the series of reactions, the borazine ring is newly introduced into the first layer, and the first layer is changed (or modified) into a layer including a borazine ring skeleton and containing Si, B, C, and N, that is, a silicon borocarbonitride layer (SiBCN layer) having a borazine ring skeleton. The SiBCN layer including a borazine ring skeleton becomes a layer having a thickness, for example, of less than one atomic layer to several atomic layers. The SiBCN layer including a borazine ring skeleton may also be referred to as a layer containing Si, C, and a borazine ring skeleton.

As the borazine ring is newly introduced into the first layer, a B component and a N component constituting the borazine ring are introduced into the first layer. In this operation, a C component contained in the ligand of the TMB is also introduced into the first layer. As such, if the borazine ring is introduced into the first layer by causing the first layer to react with the TMB, the B component, the C component, and the N component can be added into the first layer.

While the SiBCN layer including a borazine ring skeleton is formed, Cl which was contained in the first layer or H which was contained in the TMB gas generates a gaseous substance containing at least Cl or H in the course of the modification reaction of the first layer by using the TMB gas. Such gaseous substance is exhausted from the interior of the process chamber 201. As such, impurities such as Cl and the like included in the first layer are separated from the first layer by being extracted or desorbed from the first layer. Thus, the SiBCN layer including a borazine ring skeleton becomes a layer having fewer impurities such as Cl and the like than the first layer.

During the formation of the SiBCN layer including a borazine ring skeleton, if the borazine ring skeleton that constitutes the borazine ring of the TMB is maintained without being broken, it is possible to maintain a central space of the borazine ring and thus form a porous SiBCN layer.

After the SiBCN layer including a borazine ring skeleton is formed, the valve 243*b* is closed to stop the supply of the TMB gas. Then, the TMB gas which has not reacted or remains after contributing to the formation of the SiBCN layer including a borazine ring skeleton, or reaction byproduct, remaining in the process chamber 201, is removed from the interior of the process chamber 201 by the same processing procedures as used at Step 1.

As the borazine-ring-skeleton-containing gas, in addition to the TMB gas, it may be possible to use, for example, a TEB gas, a TPB gas, a TIPB gas, a TBB gas or a TIBB gas.

By performing one or more times (e.g., a predetermined number of times) the cycle that non-simultaneously performs the respective steps as described above, it is possible to form a SiBCN film having a predetermined composition and a predetermined thickness and including a borazine ring skeleton on the wafer 200. As described above with respect to the film forming sequence illustrated in FIG. 4, a thickness of the SiBCN layer formed per one cycle may be set to be smaller than a desired film thickness, and the above cycle may be repeated multiple times until the desired film thickness is obtained.

According to this modification, the same effects as those of the film forming sequence illustrated in FIG. 4 and those of Modifications 7 and 8 may be achieved. In addition, the film formed on the wafer 200 includes a film including a borazine ring skeleton, that is, a porous film having a low atomic density. Therefore, a dielectric constant of the film may be lower than that of the SiBCN film, for example, formed in Modifications 7 and 8. Moreover, the film formed on the wafer 200 includes a film including a borazine ring skeleton, that is, a film containing B as a component of the borazine ring skeleton that constitutes the film, which may improve oxidation resistance of the film.

(Modification 10)

A step of supplying a precursor gas containing Si and Cl and having a Si—Si bond, such as a HCDS gas or the like, may be performed instead of the step of supplying the BTCSM gas. Specifically, a cycle that non-simultaneously performs a step of supplying a precursor gas containing Si and Cl and having a Si—Si bond, such as a HCDS gas or the like, and a step of supplying a $NH_3$ gas may be performed a predetermined number of times (e.g., n times). Processing procedures and processing conditions at the step of supplying the $NH_3$ gas in this modification may be the same as those of the film forming sequence illustrated in FIG. 4.

At the step of supplying the HCDS gas, the HCDS gas is allowed to flow from the gas supply pipe 232*a*. Opening and closing controls of the APC valve 244 and the valves 243*a*, 243*d*, and 243*e* are executed in the same manner as those of the APC valve 244 and the valves 243*a*, 243*d*, and 243*e* at Step 1 of the film forming sequence illustrated in FIG. 4. A supply flow rate of the HCDS gas controlled by the MFC 241*a* is set to fall within a range, for example, of 1 to 2,000 sccm, specifically, 10 to 1,000 sccm. A temperature of the heater 207 is set such that a temperature of the wafers 200 reaches a temperature which falls within a range, for example, of 250 to 700 degrees C., specifically, 300 to 650 degrees C., more specifically, 350 to 600 degrees C. Other processing conditions may be the same, for example, as those of Step 1 of the film forming sequence illustrated in FIG. 4.

If a temperature of the wafers 200 is less than 250 degrees C., it is hard for HCDS to be chemically adsorbed onto the wafers 200, and thus, a practical film forming rate may not be obtained. This problem can be solved by increasing the temperature of the wafers 200 to be 250 degrees C. or higher. By setting the temperature of the wafers 200 to be 300 degrees C. or higher, specifically, 350 degrees C. or higher, the HCDS gas can be sufficiently adsorbed onto the wafer 200, which may lead to obtaining a considerably sufficient film forming rate.

If the temperature of the wafers 200 exceeds 700 degrees C., a CVD reaction becomes intensive (in other words, a gas phase reaction becomes dominant). Thus, film thickness uniformity may be hard to control and often deteriorate. By setting the temperature of the wafers 200 to be 700 degrees C. or lower, such deterioration of the film thickness uniformity can be suppressed and the film thickness uniformity can be controlled. In particular, a surface reaction becomes dominant by setting the temperature of the wafers 200 to be 650 degrees C. or lower, specifically, 600 degrees C. or lower, and thus, it becomes possible to secure the film thickness uniformity and control the film thickness uniformity.

Accordingly, the temperature of the wafers 200 may be set to fall within a range of 250 to 700 degrees C., specifically, 300 to 650 degrees C., more specifically, 350 to 600 degrees C.

By supplying the HCDS gas to the wafer 200 under the above conditions, a first layer, that is, a Si-containing layer containing Cl and having a thickness, for example, of less than one atomic layer to several atomic layers, is formed on the wafer 200 (or a base film of its surface). The Si-containing layer containing Cl may be a Si layer containing Cl, an adsorption layer of the HCDS gas, or both.

Herein, the phrase "a Si layer containing Cl" is a generic name which encompasses a continuous layer and a discontinuous layer that are formed of Si and contain Cl, and a Si thin film containing Cl that is formed by laminating the above layers. The continuous layer that is formed of Si and contains Cl may be referred to as a Si thin film containing Cl. In addition, Si constituting the Si layer containing Cl includes Si whose bond to Cl is completely broken, in addition to Si whose bond to Cl is not completely broken.

An adsorption layer of the HCDS gas includes a continuous adsorption layer in which gas molecules of the HCDS gas are continuous, and a discontinuous adsorption layer in which gas molecules of the HCDS gas are discontinuous. In other words, the adsorption layer of the HCDS gas may include an adsorption layer formed of HCDS molecules and having a thickness of one molecular layer or less than one molecular layer. The HCDS molecules that constitute the adsorption layer of the HCDS gas include a molecule in which a bond between Si and Cl is partially broken. As such, the adsorption layer of the HCDS gas may include a physical adsorption layer of the HCDS gas, a chemical adsorption layer of the HCDS gas, or both.

Herein, a layer having a thickness of less than one atomic layer refers to a discontinuously formed atomic layer. A layer having a thickness of one atomic layer refers to a continuously formed atomic layer. A layer having a thickness of less than one molecular layer means a molecular layer that is discontinuously formed. The layer having a thickness of one molecular layer refers to a continuously formed molecular layer. A Si-containing layer containing Cl may include both of a Si layer containing Cl and an adsorption layer of a HCDS gas. As described above, the Si-containing layer containing Cl is described with the terms such as "one atomic layer," "several atomic layers," and the like.

Under a condition in which the HCDS gas is autolyzed (or pyrolyzed), that is, a condition in which a pyrolysis reaction of the HCDS gas occurs, Si is deposited on the wafer 200 to form a Si layer containing Cl. Under a condition in which the HCDS gas is not autolyzed (or pyrolyzed), that is, a condition in which a pyrolysis reaction of the HCDS gas does not occur, the HCDS gas is adsorbed onto the wafer 200 to form an adsorption layer of the HCDS gas. From the viewpoint of increasing a film forming rate, it may be more advantageous to form the Si layer containing Cl on the wafer 200 than to form the adsorption layer of the HCDS gas on the wafer 200.

If a thickness of the first layer formed on the wafer 200 exceeds several atomic layers, an effect of a modification reaction at the step of supplying the $NH_3$ gas is not to be applied to the entire first layer. On the other hand, a minimum value of the thickness of the first layer to be formed on the wafer 200 is less than one atomic layer. Accordingly, the thickness of the first layer may be set to fall within a range of less than one atomic layer to several atomic layers. In addition, when the thickness of the first layer is set to be one atomic layer or less (i.e., one atomic layer or less than one atomic layer), the effect of the modification reaction at the step of supplying the $NH_3$ gas can be relatively increased. This makes it possible to shorten a time required for the modification reaction at the step of supplying the $NH_3$ gas. It is also possible to shorten a time required for forming the first layer at the step of supplying the HCDS gas. As such, a processing time per cycle can be shortened, and a total processing time can also be shortened. Accordingly, a film forming rate can be increased. In addition, if the thickness of the first layer is set to be one atomic layer or less, it is possible to better control film thickness uniformity.

As the precursor gas, in addition to the HCDS gas, it may be possible to use, for example, an inorganic precursor gas such as a tetrachlorosilane gas, that is, a silicon tetrachloride ($SiCl_4$, abbreviation: STC) gas, a trichlorosilane ($SiHCl_3$, abbreviation: TCS) gas, a dichlorosilane ($SiH_2Cl_2$, abbreviation: DCS) gas, a monochlorosilane ($SiH_3Cl$, abbreviation: MCS) gas, or the like. As the inert gas, in addition to the $N_2$ gas, it may be possible to use, for example, a rare gas such as an Ar gas, a He gas, a Ne gas, a Xe gas, or the like.

After the first layer is formed, by the same processing procedures as those of Step 1 of the film forming sequence illustrated in FIG. 4, the HCDS gas which has not reacted or remains after contributing to the formation of the first layer, remaining in the process chamber 201, is exhausted through the exhaust system and is then removed from the interior of the process chamber 201.

Thereafter, at least a portion of the first layer (i.e., the Si-containing layer containing Cl) formed on the wafer 200 is nitrided (i.e., modified) by performing the step of supplying the $NH_3$ gas. As a result of the modification of the first layer, a layer containing Si and N, that is, a silicon nitride layer (SiN layer), is formed on the wafer 200. The supply of the thermally activated $NH_3$ gas under a non-plasma condition can have the above reaction to occur softly, which in turn can facilitate the formation of the SiN layer. When the SiN layer is formed, impurities such as Cl and the like included in the first layer are separated from the first layer by being extracted or desorbed from the first layer. This aspect is the same as that of the film forming sequence illustrated in FIG. 4. Thus, the SiN layer becomes a layer having fewer impurities such as Cl and the like than the first layer. At the step of supplying the $NH_3$ gas, the temperature of the wafers 200 is set to be equal to the temperature of the wafers 200 used at the step of supplying the HCDS gas. Other processing conditions may be the same as the processing conditions of Step 2 of the film forming sequence illustrated in FIG. 4.

By performing one or more times (e.g., a predetermined number of times) the cycle that non-simultaneously performs the respective steps as described above, it is possible to form a SiN film having a predetermined composition and a predetermined thickness, as a film containing Si and N, on the wafer 200. As described above with respect to the film forming sequence illustrated in FIG. 4, a thickness of the SiN layer formed per one cycle may be set to be smaller than a desired film thickness, and the above cycle may be repeated multiple times until the desired film thickness is obtained.

According to this modification, the same effects as those of the film forming sequence illustrated in FIG. 4 may be achieved.

(Modification 11)

A cycle that non-simultaneously performs a step of supplying a HCDS gas, a step of supplying a $NH_3$ gas, and a step of supplying an $O_2$ gas may be performed a predetermined number of times (e.g., n times). According to this modification, a SiON film is formed on the wafer 200. Processing procedures and processing conditions at the respective steps in this modification may be the same as those of Modification 10, the film forming sequence illustrated in FIG. 4, and Modification 4. According to this modification, the same effects as those of the film forming sequence illustrated in FIG. 4 and those of Modification 4 may be achieved.

(Modification 12)

A cycle that non-simultaneously performs a step of supplying a HCDS gas, a step of supplying a $C_3H_6$ gas, and a step of supplying a $NH_3$ gas may be performed a predetermined number of times (e.g., n times). Processing procedures and processing conditions at the step of supplying the HCDS gas and the step of supplying the $NH_3$ gas in this modification may be the same as those of Modification 10 and those of the film forming sequence illustrated in FIG. 4.

At the step of supplying the $C_3H_6$ gas, the $C_3H_6$ gas is supplied to the wafers 200 in the wafer 200 while the exhaust system is sealed, such that the $C_3H_6$ gas is confined in the process chamber 201. In this operation, the $C_3H_6$ gas is allowed to flow from the gas supply pipe 232*c*. Opening and closing controls of the APC valve 244 and the valves 243*c*, 243*d*, and 243*e* are executed in the same manner as those of the APC valve 244 and the valves 243*b*, 243*d*, and 243*e* at Step 2 of the film forming sequence illustrated in FIG. 4. A supply flow rate of the $C_3H_6$ gas controlled by the MFC 241*c* is set to fall within a range, for example, of 100 to 10,000 sccm. A time for supplying the $C_3H_6$ gas into the process chamber 201, that is, a gas supply time (i.e., irradiation time), is set to fall within a range, for example, of 1 to 200 seconds, specifically, 1 to 120 seconds, more specifically, 1 to 60 seconds. A temperature of the wafers 200 may be set equal to the temperature of the wafers 200 used at the step of supplying the HCDS gas. Other processing conditions may be the same, for example, as those of Step 2 of the film forming sequence illustrated in FIG. 4.

By supplying the $C_3H_6$ gas into the process chamber 201 while the exhaust system is sealed, an internal pressure of the process chamber 201 is allowed to reach a pressure which falls within a range, for example, of 400 to 5,000 Pa, specifically, 500 to 4,000 Pa. In this operation, a partial pressure of the $C_3H_6$ gas in the process chamber 201 becomes a pressure which falls within a range, for example, of 360 to 4,950 Pa. By setting the internal pressure of the process chamber 201 and the partial pressure of the $C_3H_6$ gas in the process chamber 201 to fall within the above high pressure zones, the $C_3H_6$ gas supplied into the process chamber 201 may be efficiently activated by using heat, under a non-plasma condition, even if an internal temperature of the process chamber 201 at Step 2 is set to fall within a relatively low temperature zone, for example, of 400 to 500 degrees C.

By performing the step of supplying the $C_3H_6$ gas to the wafer 200 under the above conditions, a C-containing layer having a thickness of less than one atomic layer, that is, a discontinuous C-containing layer, is formed on a surface of the first layer (i.e., Si-containing layer containing Cl) formed on the wafer 200. The C-containing layer may be a C layer, a chemical adsorption layer of the $C_3H_6$ gas, or both.

After the C-containing layer is formed on the surface of the first layer, the valve 243*c* is closed to stop the supply of the $C_3H_6$ gas. By the same processing procedures as those of Step 2 of the film forming sequence illustrated in FIG. 4, the $C_3H_6$ gas which has not reacted or remains after contributing to the formation of the C-containing layer, or reaction byproduct, remaining in the process chamber 201, is removed from the interior of the process chamber 201.

As the carbon-containing gas, in addition to the $C_3H_6$ gas, it may be possible to use, for example, a hydrocarbon-based gas such as an acetylene ($C_2H_2$) gas, an ethylene ($C_2H_4$) gas or the like.

Thereafter, by performing the step of supplying the $NH_3$ gas to the wafer 200, the first layer on which the C-containing layer is formed is modified into a SiCN layer. In this operation, in order to reliably perform a reaction of the $NH_3$ gas with the first layer on which the C-containing layer is formed, that is, formation of the SiCN layer, the step of supplying the $C_3H_6$ gas may be finished before a reaction of adsorption of $C_3H_6$ gas molecules onto a surface of the first layer is saturated, that is, before the C-containing layer such as the adsorption layer (i.e., chemical adsorption layer) of the $C_3H_6$ gas or the like formed on the surface of the first layer becomes a continuous layer (i.e., while the C-containing layer is maintained as a discontinuous layer).

By performing one or more times (e.g., a predetermined number of times) the cycle that non-simultaneously performs the three steps as described above, it is possible to form a SiCN film on the wafer 200. As described above with in respect to the film forming sequence illustrated in FIG. 4, a thickness of the SiCN layer formed per one cycle may be set to be smaller than a desired film thickness and the above cycle may be repeated multiple times until the desired film thickness is obtained.

According to this modification, the same effects as those of the film forming sequence illustrated in FIG. 4 may be achieved. Furthermore, according to this modification, the SiCN film is formed, an N-free gas such as a $C_3H_6$ or the like, that is, a hydrocarbon-based gas which does not act as an N source, is used as the carbon-containing gas. Thus, a N component derived from the carbon-containing gas is prevented from being added to the SiCN film, which can increase C concentration in the finally formed SiCN film while an increase of the N concentration in the finally-formed SiCN film is suppressed. As such, a composition ratio of the SiCN film can be better controlled. Moreover, according to this modification, the carbon-containing gas is confined within the process chamber 201. Therefore, as compared with the case where the carbon-containing gas is not confined, the C concentration in the SiCN layer can be increased significantly.

(Modification 13)

A cycle that non-simultaneously performs a step of supplying a HCDS gas and a step of supplying a TEA gas may be performed a predetermined number of times (e.g., n times). According to this modification, a SiCN film is formed on the wafer 200. Processing procedures and processing conditions at the respective steps in this modification may be the same as those of the respective modifications as described above. According to this modification, the same effects as those of the film forming sequence illustrated in FIG. 4 and those of Modification 3 may be achieved.

(Modification 14)

Figure 8:
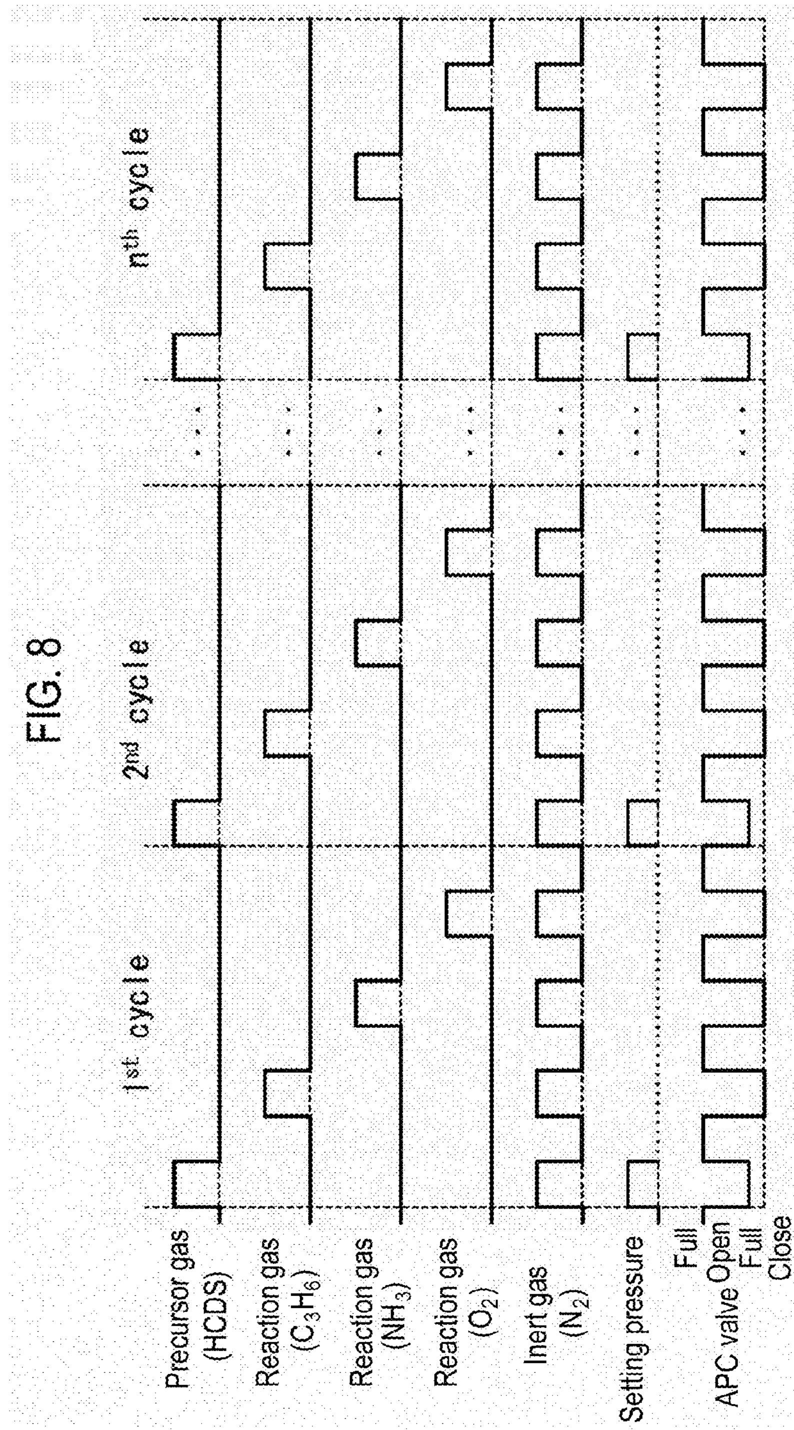
FIG. 8 illustrates Modification 14 of gas supply timings in a film forming sequence according to one embodiment of the present disclosure.

As illustrated in FIG. 8, a cycle that non-simultaneously performs a step of supplying a HCDS gas, a step of supplying a $C_3H_6$ gas, a step of supplying a $NH_3$ gas, and a step of supplying an $O_2$ gas may be performed a predetermined number of times (e.g., n times). According to this modification, a SiOCN film is formed on the wafer 200. Processing procedures and processing conditions at the respective steps of this modification may be the same as those of the respective modifications as described above. According to this modification, the same effects as those of the film forming sequence illustrated in FIG. 4 and those of Modification 4 may be achieved. Similar to Modification 12, a hydrocarbon-based gas which does not act as a N source is used as the carbon-containing gas. As such, a composition ratio of the SiOCN film can be better controlled. Moreover, the carbon-containing gas is confined in the process chamber 201. Accordingly, C concentration in the SiOCN layer can be increased significantly.

In this modification, a cycle that non-simultaneously performs the step of supplying the HCDS gas, the step of supplying the $C_3H_6$ gas, the step of supplying the $NH_3$ gas, and the step of supplying the $O_2$ gas, in the above order, may be performed a predetermined number of times (e.g., n times). Alternatively, a cycle that non-simultaneously performs the step of supplying the HCDS gas, the step of supplying the $C_3H_6$ gas, the step of supplying the $O_2$ gas, and the step of supplying the $NH_3$ gas, in the above order, may be performed a predetermined number of times (e.g., n times). As such, the order of the step of supplying the $NH_3$ gas and the step of supplying the $O_2$ gas may be interchanged. According to any of the above orders, the same effects as described above may be achieved.

(Modification 15)

A cycle that non-simultaneously performs a step of supplying a HCDS gas, a step of supplying a TEA gas, and a step of supplying an $O_2$ gas may be performed a predetermined number of times (e.g., n times). According to this modification, a SiOCN film or a SiOC film is formed on the wafer 200. Processing procedures and processing conditions at the respective steps in this modification may be the same as those of the respective modifications as described above. According to this modification, the same effects as those of the film forming sequence illustrated in FIG. 4 and those of Modification 5 may be achieved.

(Modification 16)

A cycle that non-simultaneously performs a step of supplying a HCDS gas, a step of supplying a $BCl_3$ gas, and a step of supplying a $NH_3$ gas may be performed a predetermined number of times (e.g., n times). According to this modification, a SiBN film is formed on the wafer 200. Processing procedures and processing conditions at the respective steps in this modification may be the same as those in the respective modifications as described above. According to this modification, the same effects as those of the film forming sequence illustrated in FIG. 4 and those of Modification 7 may be achieved.

(Modification 17)

A cycle that non-simultaneously performs a step of supplying a HCDS gas, a step of supplying a $C_3H_6$ gas, a step of supplying a $BCl_3$ gas, and a step of supplying a $NH_3$ gas may be performed a predetermined number of times (e.g., n times). According to this modification, a SiBCN film is formed on the wafer 200. Processing procedures and processing conditions at the respective steps in this modification may be the same as those in the respective modifications as described above. According to this modification, the same effects as those of the film forming sequence illustrated in FIG. 4 and those of Modifications 7 and 12 may be achieved.

In this modification, a cycle that non-simultaneously performs the step of supplying the HCDS gas, the step of supplying the $C_3H_6$ gas, the step of supplying the $BCl_3$ gas, and the step of supplying the $NH_3$ gas, in the above order, may be performed a predetermined number of times (e.g., n times). Alternatively, a cycle that non-simultaneously performs the step of supplying the HCDS gas, the step of supplying the $BCl_3$ gas, the step of supplying the $C_3H_6$ gas, and the step of supplying the $NH_3$ gas, in the above order, may be performed a predetermined number of times (e.g., n times). As such, the order of the step of supplying the $BCl_3$ gas and the step of supplying the $C_3H_6$ gas may be interchanged. According to any of the above orders, the same effects as described above may be achieved.

(Modification 18)

A cycle that non-simultaneously performs a step of supplying a HCDS gas, a step of supplying a $BCl_3$ gas and a step of supplying a TEA gas may be performed a predetermined number of times (e.g., n times). According to this modification, a SiBCN film is formed on the wafer 200. Processing procedures and processing conditions at the respective steps in this modification may be the same as those in the respective modifications as described above. According to this modification, the same effects as those of the film forming sequence illustrated in FIG. 4 and those of Modification 8 may be achieved.

(Modification 19)

A cycle that non-simultaneously performs a step of supplying a HCDS gas and a step of supplying a TMB gas may be performed a predetermined number of times (e.g., n times). According to this modification, a SiBCN film including a borazine ring skeleton is formed on the wafer 200. Processing procedures and processing conditions at the respective steps in this modification may be the same as those in the respective modifications as described above. According to this modification, the same effects as those of the film forming sequence illustrated in FIG. 4 and those of Modification 9 may be achieved.

(Modification 20)

Figure 9:
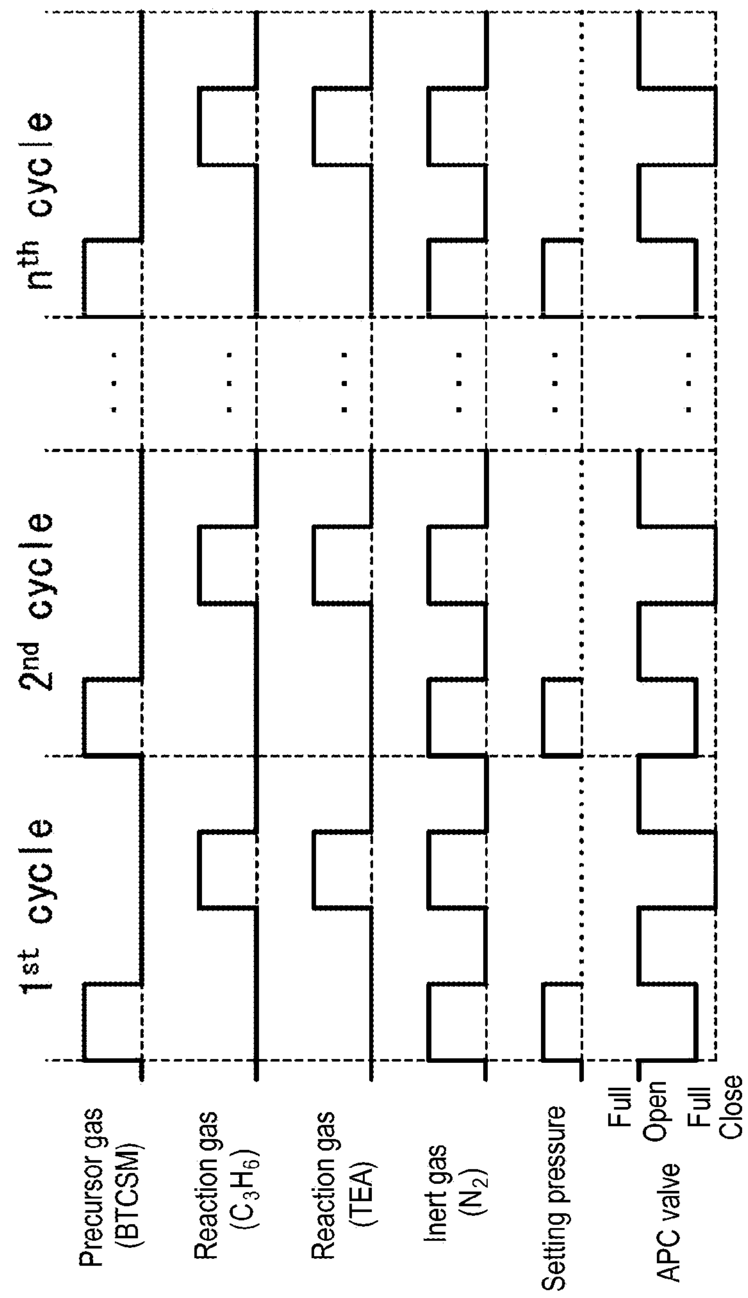
FIG. 9 illustrates Modification 20 of gas supply timings in a film forming sequence according to one embodiment of the present disclosure.

In the film forming sequence illustrated in FIG. 4 and the respective modifications described above, a $C_3H_6$ gas may be supplied simultaneously with a precursor gas such as a BTCSM gas, a HCDS gas, or the like, or simultaneously with a reaction gas such as a $NH_3$ gas, an $O_2$ gas, a TEA gas, a $BCl_3$ gas, a TMB gas, or the like. Specifically, the step of supplying the $C_3H_6$ gas may be performed simultaneously with at least one of the steps of supplying the precursor gases or simultaneously with at least one of the steps of supplying the reaction gases other than the $C_3H_6$ gas. FIG. 9 illustrates the case where, in Modification 3, the step of supplying the $C_3H_6$ gas is performed simultaneously with the step of supplying the TEA gas.

The step of supplying the $C_3H_6$ gas is performed by the same processing procedures and processing conditions, for example, as those of the step of supplying the $C_3H_6$ gas performed in Modification 12. As the carbon-containing gas, in addition to the $C_3H_6$ gas, it may be possible to use the hydrocarbon-based gases as described above.

According to this modification, the same effects as those of the film forming sequence illustrated in FIG. 4 and those of the respective modifications as described above may be achieved. Furthermore, according to this modification, a C component contained in the $C_3H_6$ gas can be added to the finally formed film. Thus, a composition ratio of the finally-formed film can be better controlled, and thus, the C concentration in the finally-formed film can be increased. However, the $C_3H_6$ gas may be supplied simultaneously with the $NH_3$ gas, the $O_2$ gas, the $BCl_3$ gas, or the TMB gas, instead of supplying the $C_3H_6$ gas simultaneously with the BTCSM gas or the HCDS gas. As a result, it is possible to avoid a gas phase reaction of the $C_3H_6$ gas in the process chamber 201 and to suppress generation of particles in the process chamber 201. Furthermore, the $C_3H_6$ gas may be supplied simultaneously with the TMB gas or the TEA gas instead of supplying the $C_3H_6$ gas simultaneously with the $BCl_2$ gas or the $NH_3$ gas. As a result, a composition ratio of the finally-formed film can be better controlled.

<Other Embodiments of the Present Disclosure>

While one embodiment of the present disclosure has been described above, the present disclosure is not limited to the above embodiment, but may be differently modified without departing from the spirit of the present disclosure.

For example, the above embodiment describes the example where the APC valve 244 is used as an exhaust flow path opening/closing unit. However, the present disclosure is not limited thereto. As an example, instead of the APC valve 244 or in addition to the APC valve 244, an opening/closing valve may be installed in the exhaust pipe 231. This opening/closing valve may be used as the exhaust flow path opening/closing unit.

As another example, when the exhaust system is sealed in the above embodiment, the APC valve 244 may not be fully closed but may be slightly opened. For example, when a reaction gas is confined in the process chamber 201, a flow of the reaction gas moving from an interior of the process chamber 201 toward the exhaust pipe 231 may be slightly formed by slightly opening the APC valve 244. Thus, a reaction byproduct generated in the process chamber 201 or gaseous substance including Cl desorbed from the first layer can be removed from the interior of the process chamber 201. As a result, the quality of the film forming process can be improved.

Figure 15:
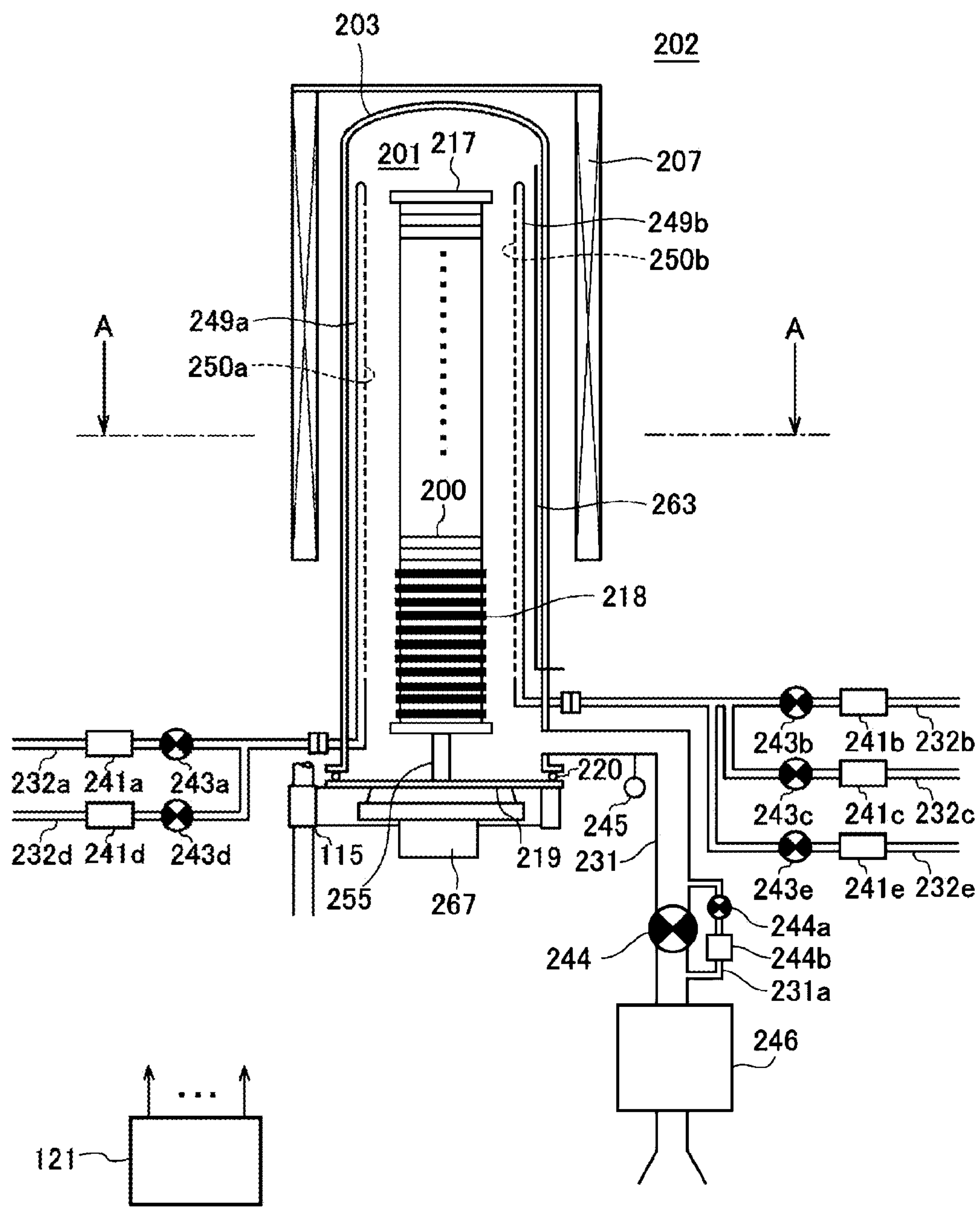
FIG. 15 schematically illustrates a configuration of a vertical processing furnace in a substrate processing apparatus that is appropriately employed in another embodiment of the present disclosure, in which a portion of the processing furnace is shown in a vertical cross section.

As a still another example, as illustrated in FIG. 15, a bypass exhaust pipe (i.e., slow exhaust pipe) 231*a* serving as a sub exhaust pipe which bypasses the APC valve 244 may be installed in the exhaust pipe 231. An inner diameter of the bypass exhaust pipe 231*a* may be set to be smaller than an inner diameter of the exhaust pipe 231. A valve 244*a* and an orifice 244*b* as a throttle portion which serves as a conductance adjusting unit is installed in the bypass exhaust pipe 231*a*. With this configuration, the conductance in the bypass exhaust pipe 231*a* can be decreased sufficiently to be smaller than the conductance within the exhaust pipe 231. By opening the valve 244*a* and the bypass exhaust pipe 231*a* when the exhaust system is sealed, the same effects as those obtained when slightly opening the APC valve 244 can be achieved, even if the APC valve 244 is fully closed. A control of the opening degree of the APC valve 244 when the exhaust flow path of the exhaust system is sealed can also be simplified. The above exhaust system may include a bypass exhaust system (or a slow exhaust system) configured with the bypass exhaust pipe 231*a*, the valve 244*a*, and the orifice 244*b*. Moreover, the above exhaust flow path may include a bypass exhaust flow path (or a slow exhaust flow path) configured with the bypass exhaust pipe 231*a* and the orifice 244*b*. In addition, a needle valve or the like provided with an opening degree adjusting mechanism may be used in place of the orifice 244*b* whose opening degree is fixed.

In the aforementioned embodiment, when a precursor gas or a reaction gas is removed from the interior of the process chamber 201, an $N_2$ gas may be supplied into the process chamber 201 by opening the valves 243*d* and 243*e*. In this operation, the $N_2$ gas acts as a purge gas, which can enhance an effect that the gas or reaction byproduct remaining in the process chamber 201 is removed from the interior of the process chamber 201.

When the precursor gas or the reaction gas is removed from the interior of the process chamber 201, the gas remaining in the process chamber 201 may not be completely removed and the interior of the process chamber 201 may not be completely purged. If an amount of gas remaining in the process chamber 201 is small, no adverse effect is caused at the step performed subsequently. In the case where the $N_2$ gas is supplied into the process chamber 201, an amount of the $N_2$ gas need not be large. For example, if the amount of the supplied $N_2$ gas is substantially equal to a volume of the reaction tube 203 (or the process chamber 201), it is possible to perform purging in such a manner that no adverse effect is caused at the step performed subsequently. Inasmuch as the interior of the process chamber 201 is not completely purged as described above, it is possible to shorten a purging time and to improve throughput. It is also possible to reduce consumption of the $N_2$ gas to a minimum necessary level.

Not only at the step of supplying the reaction gas but also at the step of supplying the precursor gas, the precursor gas may be supplied to the wafer 200 disposed in the process chamber 201 while the exhaust system is maintained to be sealed and may be confined in the process chamber 201. In this operation, the exhaust flow path of the exhaust system may be sealed. Furthermore, in this operation, an internal pressure of the process chamber 201 may be continuously increased by continuously supplying the precursor gas into the process chamber 201. In this operation, pyrolysis of the precursor gas supplied into the process chamber 201 may be promoted. Eventually, a forming rate of the first layer on the wafer 200, that is, a film forming rate of a finally-formed film can be increased. Moreover, in this operation, the precursor gas may be allowed to preliminarily flow through the process chamber 201 while the exhaust system is maintained to be opened. The precursor gas may then be supplied into and confined in the process chamber 201 while the exhaust system is maintained to be closed. In this operation, it is possible to promote removal of reaction byproduct or particles generated by the reaction of the reaction gas and the precursor gas, which remain in the process chamber 201, from the process chamber 201. As a result, the quality of the finally-formed film can be improved.

The above embodiment describes the example where a reaction gas is supplied after a precursor gas is supplied. The present disclosure is not limited thereto. The supply order of the precursor gas and the reaction gas may be reversed. Specifically, the precursor gas may be supplied after the reaction gas is supplied. By changing the supply order of the precursor gas and the reaction gas, it is possible to change the quality or composition ratio of the thin film formed according to the changed supply order. In the case where plural kinds of reaction gases are used, the supply order of the reaction gases may be arbitrarily changed. By changing the supply order of the reaction gases, it is possible to change the quality or composition ratio of the thin film formed according to the changed supply order.

If the silicon-based insulating film formed by the methods of the embodiment or the modifications as described above is used as a sidewall spacer, it is possible to provide a technique of forming a device whose leak current is small and workability is superior. If the above silicon-based insulating film is used as an etching stopper, it is possible to provide a technique of forming a device whose workability is superior. According to the embodiment or some of the modifications as described above, it is possible to form a silicon-based insulating film having an ideal stoichiometric ratio without having to use plasma. Since the silicon-based insulating film can be formed without having to use plasma, it is possible to apply to a process for forming, for example, a SADP film of a DPT, in which plasma damage is a concern.

The above embodiment describes the example where the silicon-based thin film (i.e., the SiN film, the SiON film, the SiCN film, the SiOCN film, the SiOC film, the SiBCN film or the SiBN film) containing Si as a semiconductor element is formed as a film containing a predetermined element. The present disclosure is not limited to the above example, but may be appropriately applied, for example, to the case where a metal-based thin film containing a metal element such as titanium (Ti), zirconium (Zr), hafnium (Hf), tantalum (Ta), niobium (Nb), aluminum (Al), molybdenum (Mo), tungsten (W) or the like is formed.

Specifically, the present disclosure may be suitably applied, for example, to a case where a metal-based thin film such as a TiN film, a TiON film, a TiCN film, a TiOCN film, a TiOC film, a TiBCN film, a TiBN film, a ZrN film, a ZrON film, a ZrCN film, a ZrOCN film, a ZrOC film, a ZrBCN film, a ZrBN film, a HfN film, a HfON film, a HfCN film, a HfOCN film, a HfOC film, a HfBCN film, a HfBN film, a TaN film, a TaON film, a TaCN film, a TaOCN film, a TaOC film, a TaBCN film, a TaBN film, a NbN film, a NbON film, a NbCN film, a NbOCN film, a NbOC film, a NbBCN film, a NbBN film, an AlN film, an AlON film, an AlCN film, an AlOCN film, an AlOC film, an AlBCN film, an AlBN film, a MoN film, a MoON film, a MoCN film, a MoOCN film, a MoOC film, a MoBCN film, a MoBN film, a WN film, a WON film, a WCN film, a WOCN film, a WOC film, a WBCN film, a WBN film or the like is formed. In this case, instead of the precursor gas containing Si used in the above embodiment, a precursor gas containing a metal element may be used as the precursor gas. Film formation may be performed by the same sequence as that of the embodiment or the modifications as described above.

In the case of forming a Ti-based thin film, for example, a precursor gas containing Ti and a halogen element may be used as a precursor gas containing Ti. As the precursor gas containing Ti and a halogen element, it may be possible to use, for example, a precursor gas containing Ti and a chloro group such as a titanium tetrachloride ($TiCl_4$) gas or the like, or a precursor gas containing Ti and a fluoro group such as a titanium tetrafluoride ($TiF_4$) gas or the like. As the reaction gas, it may be possible to use the same gas as used in the above embodiment. Processing conditions used in this case may be the same, for example, as the processing conditions of the above embodiment.

In the case of forming a Zr-based thin film, for example, a precursor gas containing Zr and a halogen element may be used as a precursor gas containing Zr. As the precursor gas containing Zr and a halogen element, it may be possible to use, for example, a precursor gas containing Zr and a chloro group such as a zirconium tetrachloride ($ZrCl_4$) gas or the like, or a precursor gas containing Zr and a fluoro group such as a zirconium tetrafluoride ($ZrF_4$) gas or the like. As the reaction gas, it may be possible to use the same gas as used in the aforementioned embodiment. Processing conditions used in this case may be the same, for example, as the processing conditions of the above embodiment.

In the case of forming a Hf-based thin film, for example, a precursor gas containing Hf and a halogen element may be used as a precursor gas containing Hf. As the precursor gas containing Hf and a halogen element, it may be possible to use, for example, a precursor gas containing Hf and a chloro group such as a hafnium tetrachloride ($HfCl_4$) gas or the like, or a precursor gas containing Hf and a fluoro group such as a hafnium tetrafluoride ($HfF_4$) gas or the like. As the reaction gas, it may be possible to use the same gas as used in the above embodiment. Processing conditions used in this case may be the same, for example, as the processing conditions of the above embodiment.

In the case of forming a Ta-based thin film, for example, a precursor gas containing Ta and a halogen element may be used as a precursor gas containing Ta. As the precursor gas containing Ta and a halogen element, it may be possible to use, for example, a precursor gas containing Ta and a chloro group such as a tantalum pentachloride ($TaCl_5$) gas or the like, or a precursor gas containing Ta and a fluoro group such as a tantalum pentafluoride ($TaF_5$) gas or the like. As the reaction gas, it may be possible to use the same gas as used in the above embodiment. Processing conditions used in this case may be the same, for example, as the processing conditions of the above embodiment.

In the case of forming a Nb-based thin film, for example, a precursor gas containing Nb and a halogen element may be used as a precursor gas containing Nb. As the precursor gas containing Nb and a halogen element, it may be possible to use, for example, a precursor gas containing Nb and a chloro group such as a niobium pentachloride ($NbCl_5$) gas or the like, or a precursor gas containing Nb and a fluoro group such as a niobium pentafluoride ($NbF_5$) gas or the like. As the reaction gas, it may be possible to use the same gas as used in the above embodiment. Processing conditions used in this case may be the same, for example, as the processing conditions of the above embodiment.

In the case of forming an Al-based thin film, for example, a precursor gas containing Al and a halogen element may be used as a precursor gas containing Al. As the precursor gas containing Al and a halogen element, it may be possible to use, for example, a precursor gas containing Al and a chloro group such as an aluminum trichloride ($AlCl_3$) gas or the like, or a precursor gas containing Al and a fluoro group such as an aluminum trifluoride ($AlF_3$) gas or the like. As the reaction gas, it may be possible to use the same gas as used in the above embodiment. Processing conditions used in this case may be the same, for example, as the processing conditions of the above embodiment.

In the case of forming a Mo-based thin film, for example, a precursor gas containing Mo and a halogen element may be used as a precursor gas containing Mo. As the precursor gas containing Mo and a halogen element, it may be possible to use, for example, a precursor gas containing Mo and a chloro group such as a molybdenum pentachloride ($MoCl_5$) gas or the like, or a precursor gas containing Mo and a fluoro group such as a molybdenum pentafluoride ($MoF_5$) gas or the like. As the reaction gas, it may be possible to use the same gas as used in the above embodiment. Processing conditions used in this case may be the same, for example, as the processing conditions of the above embodiment.

In the case of forming a W-based thin film, for example, a precursor gas containing W and a halogen element may be used as a precursor gas containing W. As the precursor gas containing W and a halogen element, it may be possible to use, for example, a precursor gas containing W and a chloro group such as a tungsten hexachloride ($WCl_6$) gas or the like, or a precursor gas containing W and a fluoro group such as a tungsten hexafluoride ($WF_6$) gas or the like. As the reaction gas, it may be possible to use the same gas as used in the above embodiment. Processing conditions used in this case may be the same, for example, as the processing conditions of the above embodiment.

That is to say, the present disclosure may be suitably applied to the case where a thin film containing a predetermined element such as a semiconductor element, a metal element, or the like is formed.

Process recipes (e.g., programs describing processing procedures and processing conditions) used in forming these various kinds of films may be prepared individually (in a plural number) according to the contents of substrate processing (e.g., a kind, a composition ratio, a quality, and a thickness of a film to be formed). In addition, at the start of the substrate processing, an appropriate process recipe may be properly selected from the process recipes according to the substrate processing contents. Specifically, the process recipes individually prepared according to the substrate processing contents may be stored (or installed) in advance in the memory device 121*c* of the substrate processing apparatus via a telecommunication line or a recording medium (e.g., the external memory device 123) storing the process recipes. Moreover, at the start of the substrate processing, the CPU 121*a* of the substrate processing apparatus may properly select an appropriate process recipe from the process recipes stored in the memory device 121*c* according to the substrate processing contents. This configuration enables a single substrate processing apparatus to form films of different kinds, composition ratios, qualities, and thicknesses for general purposes and with enhanced reproducibility. In addition, this configuration can reduce an operator's operation burden (e.g., a burden borne by an operator when inputting processing procedures and processing conditions), thereby avoiding a manipulation error and quickly starting the substrate processing.

The process recipes as described above are not limited to newly-prepared ones but may be prepared, for example, by modifying existing process recipes already installed in the substrate processing apparatus. In the case of modifying the process recipes, the modified process recipes may be installed in the substrate processing apparatus via a telecommunication line or a recording medium storing the process recipes. In addition, the existing process recipes already installed in the substrate processing apparatus may be directly modified by operating the input/output device 122 of the substrate processing apparatus.

The above embodiment describes the example in which thin films are formed using a batch type substrate processing apparatus capable of processing a plurality of substrates at one time. The present disclosure is not limited to the above embodiment, but may be appropriately applied, for example, to the case where thin films are formed using a single-wafer-type substrate processing apparatus capable of processing a single substrate or several substrates at one time. In addition, the above embodiment describes the example in which thin films are formed using a substrate processing apparatus provided with a hot-wall-type processing furnace. The present disclosure is not limited to the above embodiment, but may be appropriately applied to the case where thin films are formed using a substrate processing apparatus provided with a cold-wall-type processing furnace. In these cases, the processing conditions may be the same as those of the above embodiment.

Figure 16A:
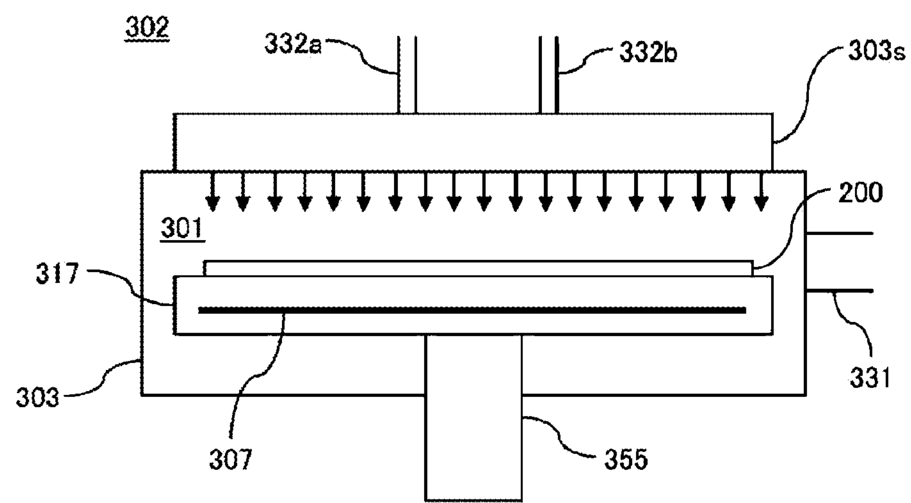
FIG. 16A schematically illustrates a configuration of the vertical processing furnace in the substrate processing apparatus that is appropriately employed in the embodiment of the present disclosure, in which a portion of the processing furnace is shown in a vertical cross section.

For example, the present disclosure may be appropriately applied to the case where a film is formed using a substrate processing apparatus provided with a processing furnace 302 illustrated in FIG. 16A. The processing furnace 302 includes a process vessel 303 which defines a process chamber 301, a shower head 303*s* configured to supply a gas into the process chamber 301 in a shower-like manner, a support table 317 configured to horizontally support one or more wafers 200, a rotation shaft 355 configured to support the support table 317 from below, and a heater 307 installed in the support table 317. A gas supply port 332*a* configured to supply the above precursor gas and a gas supply port 332*b* configured to supply the above reaction gas are connected to inlets (i.e., gas introduction holes) of the shower head 303*s*. A precursor gas supply system identical to the precursor gas supply system of the above embodiment is connected to the gas supply port 332*a*. A reaction gas supply system identical to the reaction gas supply system of the above embodiment is connected to the gas supply port 332*b*. A gas distribution plate configured to supply a gas into the process chamber 301 in a shower-like manner is installed in outlets (i.e., gas discharge holes) of the shower head 303*s*. An exhaust port 331 configured to evacuate an interior of the process chamber 301 is installed in the process vessel 303. An exhaust system identical to the exhaust system of the above embodiment is connected to the exhaust port 331.

Figure 16B:
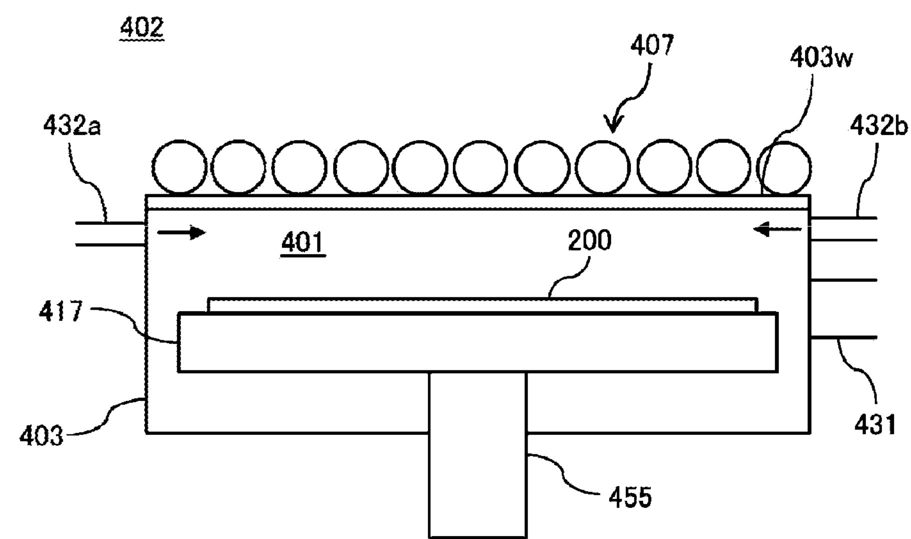
FIG. 16B schematically illustrates another configuration of the vertical processing furnace in the substrate processing apparatus that is appropriately employed in the embodiment of the present disclosure, in which a portion of the processing furnace is shown in a vertical cross section.

As another example, the present disclosure may be appropriately applied to the case where a film is formed using a substrate processing apparatus provided with a processing furnace 402 illustrated in FIG. 16B. The processing furnace 402 includes a process vessel 403 which defines a process chamber 401, a support table 417 configured to horizontally support one or more wafers 200, a rotation shaft 455 configured to support the support table 417 from below, a lamp heater 407 configured to irradiate light toward the wafer 200 disposed within the process vessel 403, and a quartz window 403*w* which transmits the light irradiated from the lamp heater 407. A gas supply port 432*a* configured to supply the above precursor gas and a gas supply port 432*b* configured to the supply the above reaction gas are connected to the process vessel 403. A precursor gas supply system identical to the precursor gas supply system of the above embodiment is connected to the gas supply port 432*a*. A reaction gas supply system identical to the reaction gas supply system of the above embodiment is connected to the gas supply port 432*b*. An exhaust port 431 configured to evacuate an interior of the process chamber 401 is installed in the process vessel 403. An exhaust system identical to the exhaust system of the aforementioned embodiment is connected to the exhaust port 431.

In the case of using these substrate processing apparatuses, film formation can be performed by the same sequences and processing conditions as those of the embodiments and modifications as described above.

The embodiments and modifications described above may be appropriately combined with one another. In addition, processing conditions for such combinations may be the same, for example, as the processing conditions of the embodiments described above.

EXAMPLES

Figure 10A:
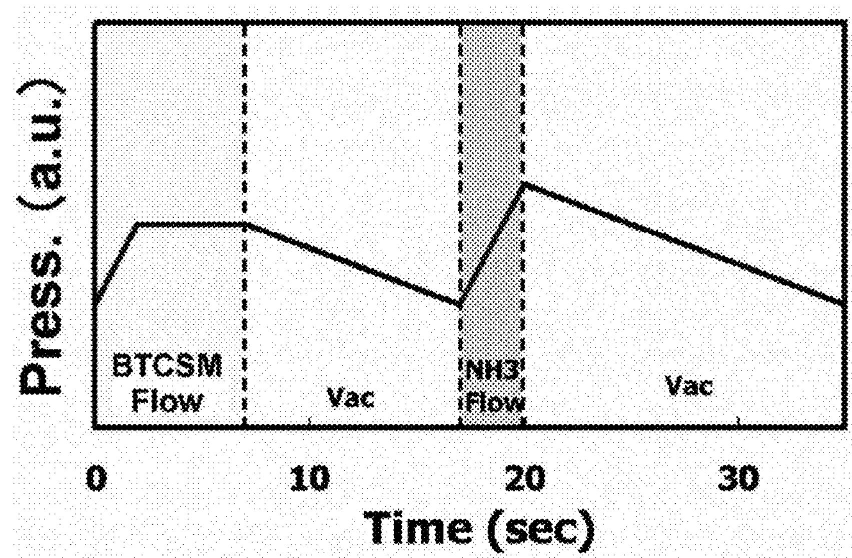
FIG. 10A illustrates change of an internal pressure of a process chamber in a film forming sequences of Example 1.

In Example 1, using the substrate processing apparatus of the above embodiment, a SiCN film was formed on a wafer according to the film forming sequence illustrated in FIG. 4. A BTCSM gas was used as a precursor gas. A $NH_3$ gas was used as a reaction gas. At a step of supplying the BTCSM gas, a supply flow rate of the BTCSM gas was set to be 100 sccm and a supply flow rate of an $N_2$ gas was set to be 100 sccm. An APC valve was controlled such that an internal pressure of a process chamber is kept constant at 3 Torr (400 Pa). At a step of supplying the $NH_3$ gas, a supply flow rate of the $NH_3$ gas was set to be 1,000 sccm and a supply flow rate of the $N_2$ gas was set to be 100 sccm. The APC valve was fully closed. A supply time of the $NH_3$ gas was set to be 3 seconds. A film forming temperature was set to be 400 degrees C. Other processing conditions were set to fall within the range of the processing conditions used in the above embodiment. FIG. 10A is a view illustrating a change of the internal pressure of the process chamber in the film forming sequence of this example. The horizontal axis indicates an elapsed time (sec) within one cycle. The vertical axis indicates the internal pressure (a.u.) of the process chamber.

Figure 10B:
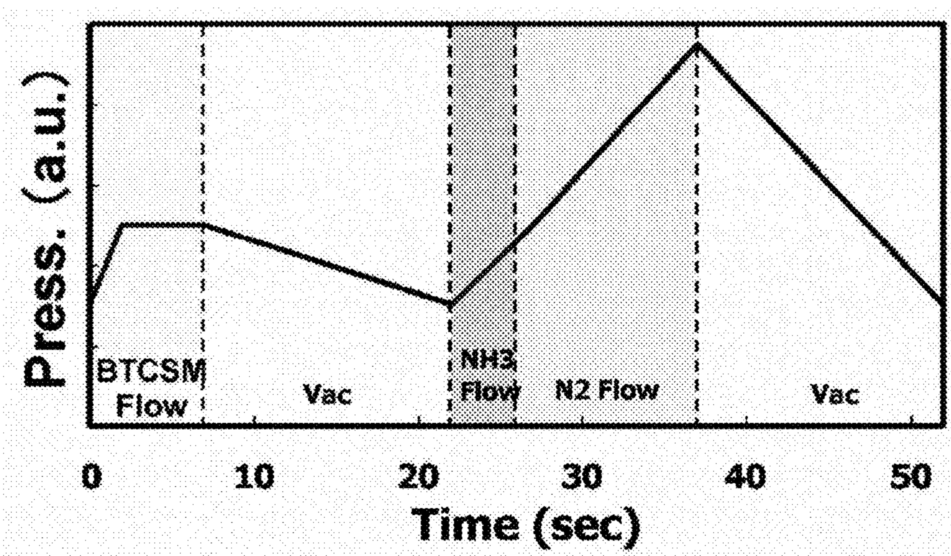
FIG. 10B illustrates change of an internal pressure of a process chamber in a film forming sequences of Example 2.

In Example 2, using the substrate processing apparatus of the above embodiment, a SiCN film was formed on a wafer according to the film forming sequence illustrated in FIG. 5. A BTCSM gas was used as a precursor gas. A $NH_3$ gas was used as a reaction gas. At a step of supplying the BTCSM gas, a supply flow rate of the BTCSM gas was set to be 100 sccm and a supply flow rate of an $N_2$ gas was set to be 100 sccm. The APC valve was controlled such that an internal pressure of the process chamber is kept constant at 3 Torr (400 Pa). At a step of supplying the $NH_3$ gas, a supply flow rate of the $NH_3$ gas was set at 1,000 sccm and a supply flow rate of the $N_2$ gas was set to be 100 sccm. The APC valve was fully closed. A supply time of the $NH_3$ gas was set to be 3 seconds. A supply time of the $N_2$ gas after stopping the supply of the $NH_3$ gas was set to be 12 seconds. A film forming temperature was to be at 400 degrees C. Other processing conditions were set to fall within the range of the processing conditions used in the above embodiment. FIG. 10B is a view illustrating a change of the internal pressure of the process chamber in the film forming sequence of this example. The horizontal axis indicates an elapsed time (sec) within one cycle. The vertical axis indicates the internal pressure (a.u.) of the process chamber.

Figure 10C:
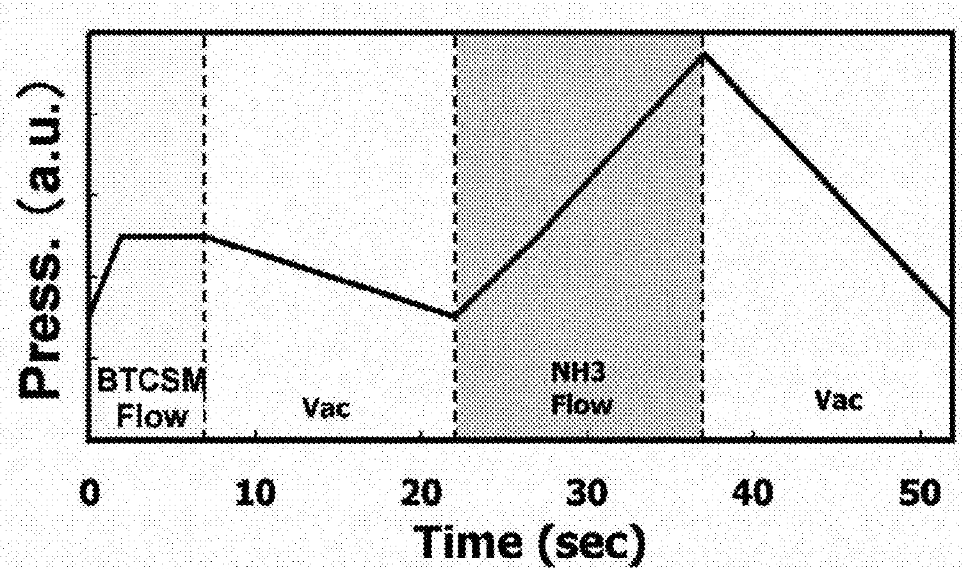
FIG. 10C illustrates change of an internal pressure of a process chamber in a film forming sequences of Example 3.

In Example 3, using the substrate processing apparatus of the above embodiment, a SiCN film was formed on a wafer according to the film forming sequence illustrated in FIG. 4. A BTCSM gas was used as a precursor gas. A $NH_3$ gas was used as a reaction gas. At a step of supplying the BTCSM gas, a supply flow rate of the BTCSM gas was set to be 100 sccm and a supply flow rate of an $N_2$ gas was set to be 100 sccm. The APC valve was controlled such that an internal pressure of the process chamber is kept constant at 3 Torr (400 Pa). At a step of supplying the $NH_3$ gas, a supply flow rate of the $NH_3$ gas was set to be 1,000 sccm and a supply flow rate of the $N_2$ gas was set to be 100 sccm. The APC valve was fully closed. A supply time of the $NH_3$ gas was set to be 15 seconds. A film forming temperature was set at 400 degrees C. Other processing conditions were set to fall within the range of the processing conditions used in the above embodiment. FIG. 10C is a view illustrating a change of the internal pressure of the process chamber in the film forming sequence of this example. The horizontal axis indicates an elapsed time (sec) within one cycle. The vertical axis indicates the internal pressure (a.u.) of the process chamber.

Figure 11:
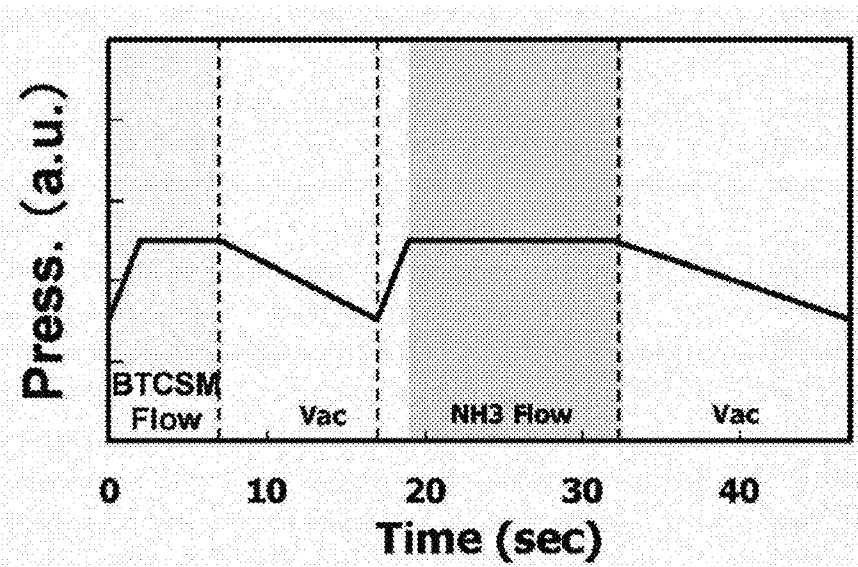
FIG. 11 illustrates change of an internal pressure of a process chamber in a film forming sequence of a comparative example.

In a comparative example, using the substrate processing apparatus of the above embodiment, a SiCN film was formed on a wafer according to a film forming sequence in which a step of supplying a BTCSM gas to the wafer in the process chamber and a step of supplying a $NH_3$ gas to the wafer in the process chamber are alternately performed a predetermined number of times. At the step of supplying the BTCSM gas, a supply flow rate of the BTCSM gas was set to be 100 sccm and a supply flow rate of an $N_2$ gas was set to be 1,200 sccm. The APC valve was controlled such that an internal pressure of the process chamber is kept constant at 5 Torr (667 Pa). At the step of supplying the $NH_3$ gas, a supply flow rate of the $NH_3$ gas was set to be 500 sccm and a supply flow rate of the $N_2$ gas was set to be 1,200 sccm. The APC valve was controlled such that an internal pressure of the process chamber is kept constant at 5 Torr (667 Pa). That is to say, the APC valve was controlled such that the internal pressures of the process chamber at the respective steps become equal to each other. Other processing conditions were set to fall within the range of the processing conditions used in the aforementioned embodiment. FIG. 11 is a view illustrating a change of the internal pressure of the process chamber in the film forming sequence of the comparative example. The horizontal axis in FIG. 11 indicates an elapsed time (sec) within one cycle. The vertical axis indicates the internal pressure (a.u.) of the process chamber.

Figure 12:
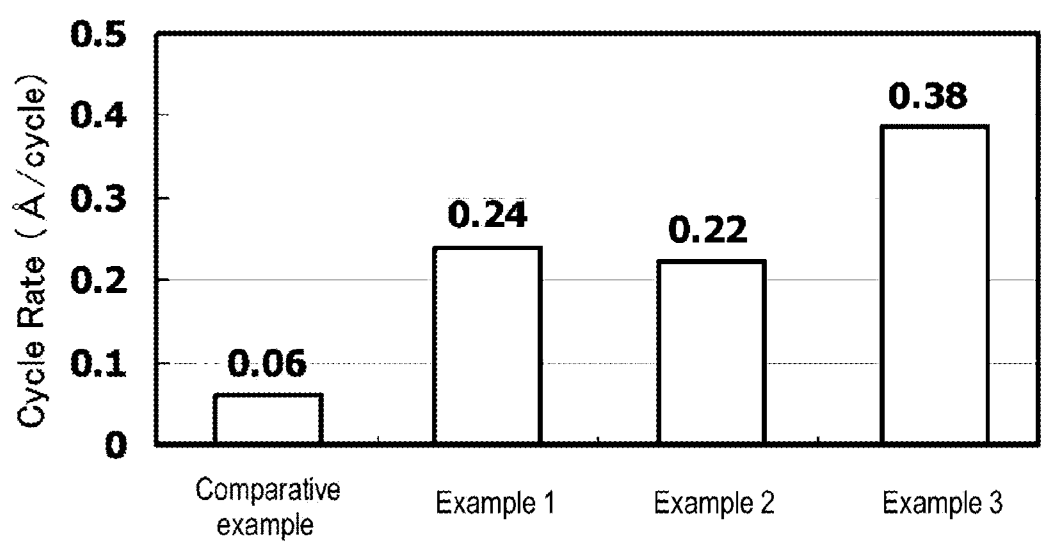
FIG. 12 illustrates film forming rates of an SiCN film in the examples and the comparative example.

Film forming rates of the SiCN films in the respective examples and the comparative example were measured. FIG. 12 is a view illustrating the film forming rates of the SiCN films in the respective examples and the comparative example. The vertical axis in FIG. 12 indicates a thickness of the SiCN film formed per one cycle, that is, a cycle rate (Å/cycle). The horizontal axis indicates the comparative example and the respective examples in order. As such, FIG. 12 illustrates the cycle rates as the film forming rates of the SiCN films in the respective examples and the comparative example.

It can be noted in FIG. 12 that the film forming rates (0.24, 0.22, and 0.38 Å/cycle in order) of Examples 1 to 3 are higher than the film forming rate (0.06 Å/cycle) of the comparative example. Thus, it can be appreciated that the film forming rates of the SiCN films are improved by supplying the $NH_3$ gas to the wafer in the process chamber while the exhaust system is sealed, and the $NH_3$ gas is confined in the process chamber. It can also be appreciated that the film forming rate of Example 3 is higher than the film forming rates of Examples 1 and 2. Thus, it can be noted that the film forming rates of the SiCN films are further improved by continuously supplying the $NH_3$ gas into the process chamber, that is, by continuously increasing the internal pressure of the process chamber, when the $NH_3$ gas is confined in the process chamber.

<Aspects of the Present Disclosure>

Hereinafter, some aspects of the present disclosure are additionally described as supplementary notes.

(Supplementary Note 1)

According to one aspect of the present disclosure, there are provided a method of manufacturing a semiconductor device and a method of processing a substrate, including forming a film on the substrate by performing a cycle a predetermined number of times, the cycle including non-simultaneously performing: (a) supplying a precursor gas to the substrate in a process chamber; (b) exhausting the precursor gas in the process chamber through an exhaust system; (c) confining a reaction gas, which differs in chemical structure from the precursor gas, in the process chamber by supplying the reaction gas to the substrate in the process chamber while the exhaust system is closed; and (d) exhausting the reaction gas in the process chamber through the exhaust system while the exhaust system is opened (Supplementary Note 2)

According to the method of Supplementary Note 1, in the (c), the exhaust system (e.g., an exhaust flow path of the exhaust system) may be sealed.

(Supplementary Note 3)

According to the method of Supplementary Note 1 or 2, in the (c), an exhaust flow path of the exhaust system may be fully closed (Supplementary Note 4)

According to the method of any one of Supplementary Notes 1 to 3, in the (c), an exhaust flow path opening/closing unit (e.g., an exhaust valve) installed in the exhaust system may be fully closed.

(Supplementary Note 5)

According to the method of any one of Supplementary Notes 1 to 4, in the (c), the reaction gas may be continuously supplied into the process chamber.

(Supplementary Note 6)

According to the method of any one of Supplementary Notes 1 to 5, in the (c), an internal pressure of the process chamber may be continuously increased.

(Supplementary Note 7)

According to the method of any one of Supplementary Notes 1 to 6, in the (c), the reaction gas may be allowed to preliminarily flow through the process chamber while the exhaust system is opened, and the reaction gas may then be supplied into and confined in the process chamber while the exhaust system is closed.

(Supplementary Note 8)

According to the method of any one of Supplementary Notes 1 to 7, a target internal pressure of the process chamber in the (c) may be set to be higher than a target internal pressure of the process chamber in the (a).

(Supplementary Note 9)

According to the method of any one of Supplementary Notes 1 to 8, an opening degree of an exhaust flow path of the exhaust system in the (c) may be set to be smaller than an opening degree of the exhaust flow path in the (a).

(Supplementary Note 10)

According to the method of any one of Supplementary Notes 1 to 9, an opening degree of an exhaust flow path opening/closing unit installed in the exhaust system in the (c) may be set to be smaller than an opening degree of the exhaust flow path opening/closing unit in the (a).

(Supplementary Note 11)

According to the method of any one of Supplementary Notes 1 to 10, the reaction gas may include at least one selected from a group consisting of a nitrogen-containing gas (e.g., a hydrogen nitride-based gas), a carbon-containing gas (e.g., a hydrocarbon-based gas), a nitrogen- and carbon-containing gas (e.g., an amine-based gas and an organic hydrazine-based gas), a boron-containing gas (e.g., a borane-based gas), and a boron-, nitrogen- and carbon-containing gas (e.g., a borazine-based gas).

(Supplementary Note 12)

According to the method of any one of Supplementary Notes 1 to 11, the reaction gas may include a nitrogen-containing gas (e.g., nitriding gas).

(Supplementary Note 13)

According to the method of any one of Supplementary Notes 1 to 12, the reaction gas may include a hydrogen nitride-based gas.

(Supplementary Note 14)

According to the method of any one of Supplementary Notes 1 to 13, the reaction gas may include at least one selected from a group consisting of an ammonia gas, a hydrazine gas, and a diazene gas.

(Supplementary Note 15)

According to the method of any one of Supplementary Notes 1 to 14, the cycle may be performed a predetermined number of times under a non-plasma condition.

(Supplementary Note 16)

According to another aspect of the present disclosure, there is provided a substrate processing apparatus, including a process chamber configured to accommodate a substrate;

precursor gas supply system configured to supply a precursor gas into the process chamber; a reaction gas supply system configured to supply a reaction gas, which differs in chemical structure from the precursor gas, into the process chamber; an exhaust system configured to evacuate an interior of the process chamber; and a control unit configured to control the precursor gas supply system, the reaction gas supply system, and the exhaust system so as to perform a process of forming a film on the substrate by performing a cycle a predetermined number of times, the cycle including non-simultaneously performing: (a) supplying the precursor gas to the substrate in the process chamber; (b) exhausting the precursor gas in the process chamber through the exhaust system; (c) confining the reaction gas, which differs in chemical structure from the precursor gas, in the process chamber by supplying the reaction gas to the substrate in the process chamber while the exhaust system is closed; and (d) exhausting the reaction gas in the process chamber through the exhaust system while the exhaust system is opened.

(Supplementary Note 17)

According to a still another aspect of the present disclosure, there are provided a program and a non-transitory computer-readable recording medium storing the program, wherein the program causes a computer to perform a process of forming a film on a substrate by performing a cycle a predetermined number of times, the cycle including non-simultaneously performing: (a) supplying a precursor gas to the substrate in a process chamber; (b) exhausting the precursor gas in the process chamber through an exhaust system; (c) confining a reaction gas, which differs in chemical structure from the precursor gas, in the process chamber by supplying the reaction gas to the substrate in the process chamber while the exhaust system is closed; and (d) exhausting the reaction gas in the process chamber through the exhaust system while the exhaust system is opened.

According to the present disclosure, it is possible to improve productivity of a process of forming a film and quality of such a film without having to use plasma when the film is formed on a substrate using a precursor gas and a reaction gas.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

forming a film on a substrate by performing a cycle a predetermined number of times, the cycle including non-simultaneously performing:

(a) supplying a precursor gas to the substrate in a process chamber;

(b) exhausting the precursor gas in the process chamber through an exhaust system;

(c) confining a reaction gas, which differs in chemical structure from the precursor gas, in the process chamber by supplying the reaction gas to the substrate in the process chamber while the exhaust system is sealed; and (d) exhausting the reaction gas in the process chamber through the exhaust system while the exhaust system is opened, wherein, in the act of (c), the reaction gas is allowed to preliminarily flow through the process chamber while the exhaust system is opened, and the reaction gas is then supplied into and confined in the process chamber while the exhaust system is sealed, and wherein the reaction gas comprises at least one selected from a group consisting of an ammonia gas, a hydrazine gas, a diazene gas, an amine-based gas, and an organic hydrazine-based gas.

2. The method of claim 1, wherein, in a period in which the exhaust system is sealed in the act of (c), an exhaust flow path opening/closing unit installed in the exhaust system is fully closed.

3. The method of claim 1, wherein, in the act of (c), the reaction gas is continuously supplied into the process chamber.

4. The method of claim 1, wherein, in the act of (c), an internal pressure of the process chamber is continuously increased.

5. The method of claim 1, wherein the act of (a) includes setting an internal pressure of the process chamber to a first pressure, and the act of (c) includes setting the internal pressure of the process chamber to a second pressure higher than the first pressure.

6. The method of claim 1, wherein an opening degree of an exhaust flow path of the exhaust system in the act of (c) is set to be smaller than an opening degree of the exhaust flow path in the act of (a).

7. The method of claim 1, wherein an opening degree of an exhaust flow path opening/closing unit installed in the exhaust system in the act of (c) is set to be smaller than an opening degree of the exhaust flow path opening/closing unit in the act of (a).

8. The method of claim 1, wherein the reaction gas comprises at least one selected from a group consisting of a nitrogen-containing gas, a carbon-containing gas, a nitrogen- and carbon-containing gas, a boron-containing gas, and a boron-, nitrogen- and carbon-containing gas.

9. The method of claim 1, wherein the reaction gas comprises a hydrogen nitride-based gas.

10. The method of claim 1, wherein the reaction gas is an ammonia gas.

11. The method of claim 1, wherein the reaction gas is an amine-based gas.

12. The method of claim 1, wherein the cycle is performed the predetermined number of times under a non-plasma condition.

13. The method of claim 1, wherein the act of (a) includes setting an opening degree of the exhaust flow path opening/closing unit to a first degree, and wherein the act of (c) includes setting the opening degree of the exhaust flow path opening/closing unit installed in the exhaust system to a second degree smaller than the first degree during a period when the reaction gas preliminarily flows through the process chamber.

14. The method of claim 1, wherein the reaction gas is a hydrazine gas.

15. The method of claim 1, wherein the reaction gas is a diazene gas.

* * * * *